US012158679B2

(12) United States Patent
Kawai et al.

(10) Patent No.: US 12,158,679 B2
(45) Date of Patent: Dec. 3, 2024

(54) DISPLAY DEVICE

(71) Applicant: Japan Display Inc., Tokyo (JP)

(72) Inventors: Kentaro Kawai, Tokyo (JP); Masataka Ikeda, Tokyo (JP); Hirotaka Hayashi, Tokyo (JP); Yuuji Oomori, Tokyo (JP); Yoshihide Ohue, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/312,608

(22) Filed: May 5, 2023

(65) Prior Publication Data

US 2023/0369348 A1 Nov. 16, 2023

(30) Foreign Application Priority Data

May 12, 2022 (JP) .................. 2022-079105

(51) Int. Cl.
*G02F 1/1362* (2006.01)
*G02F 1/1345* (2006.01)
*G02F 1/1368* (2006.01)
*G02F 1/1334* (2006.01)
*G09G 3/36* (2006.01)
*H01L 27/12* (2006.01)

(52) U.S. Cl.
CPC .... *G02F 1/136286* (2013.01); *G02F 1/13452* (2013.01); *G02F 1/136227* (2013.01); *G02F 1/1368* (2013.01); *G02F 1/13347* (2021.01); *G02F 2203/01* (2013.01); *G09G 3/3648* (2013.01); *G09G 3/3677* (2013.01); *G09G 2310/08* (2013.01); *H01L 27/124* (2013.01)

(58) Field of Classification Search
None
See application file for complete search history.

(56) References Cited

U.S. PATENT DOCUMENTS

| 2011/0299003 | A1* | 12/2011 | Arasawa | G02F 1/136286 349/43 |
| 2020/0127011 | A1* | 4/2020 | Yamazaki | G02F 1/136286 |
| 2022/0004052 | A1 | 1/2022 | Ohue | |

FOREIGN PATENT DOCUMENTS

| JP | 2020-160254 A | 10/2020 |
| WO | 2018/130920 A1 | 7/2018 |

* cited by examiner

*Primary Examiner* — Dung T Nguyen
(74) *Attorney, Agent, or Firm* — XSENSUS LLP

(57) ABSTRACT

A display device includes a first pixel, a second pixel, and a third pixel arranged in a first direction in a display area arranged on a first substrate, a first source wiring, a second wiring, and a third wiring extending in the first direction, and connected to each of the first pixel to the third pixel, and a first gate wiring, a second gate wiring, and a third wiring intersecting the first direction, and connected to each of the first pixel to the third pixel. The first pixel includes a first transistor electrically connected to the first gate wiring and the first source wiring and a liquid crystal element electrically connected to the first transistor, the first pixel to the third pixel are arranged between the first source wiring and the third source wiring, and the second source wiring, and the first source wiring intersects the third source wiring.

11 Claims, 17 Drawing Sheets

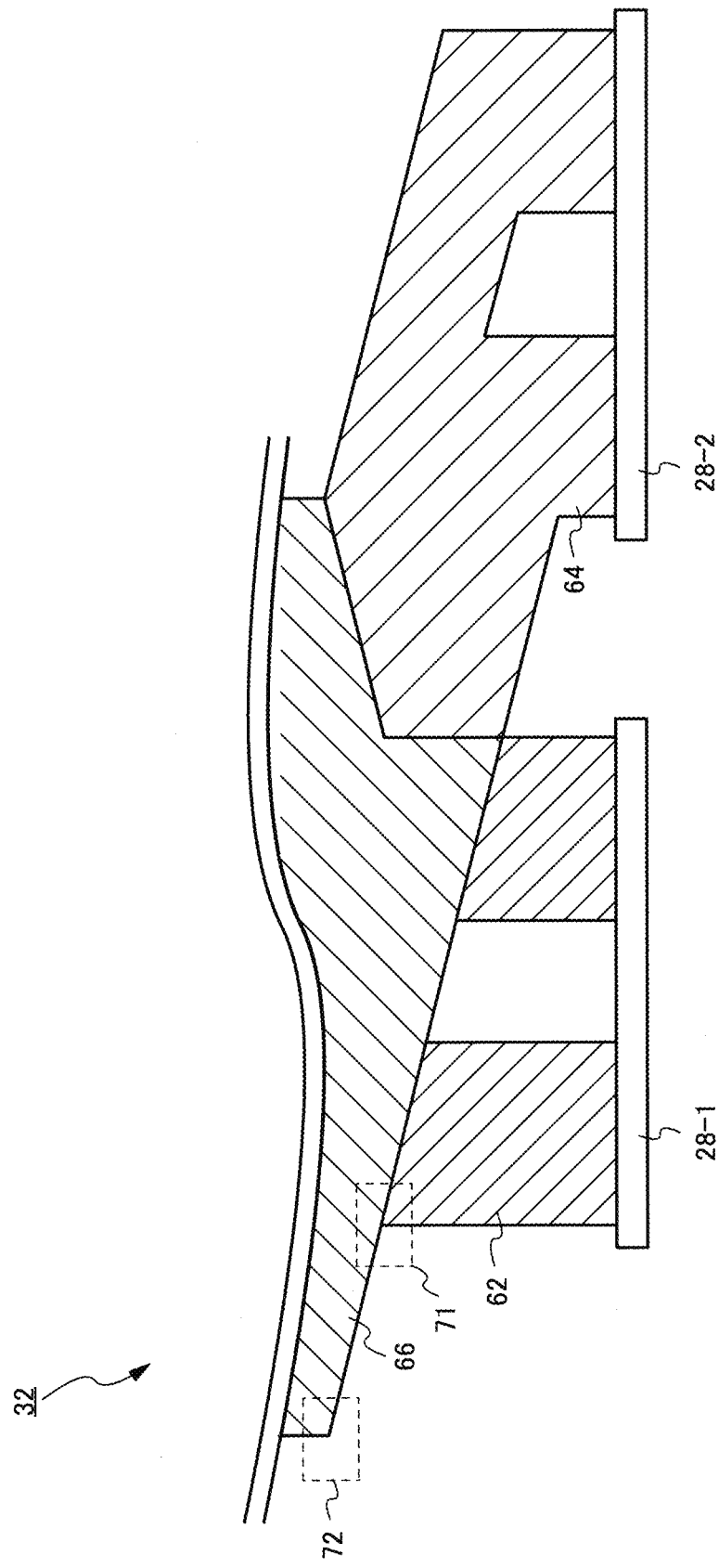

DISPLAY DEVICE

CROSS-REFERENCE TO RELATED APPLICATION

This application claims the benefit of priority to Japanese Patent Application No. 2022-079105, filed on May 12, 2022, the entire contents of which are incorporated herein by reference.

FIELD

An embodiment of the present invention relates to a display device and a driving method of the display device.

BACKGROUND

In a conventional liquid crystal display device, a gate wiring is turned on one row at a time for a plurality of pixels arranged in a matrix, and the plurality of pixels arranged in one column is sequentially charged with the same source wiring. However, in the case of driving a high-speed driving panel such as a transparent display and a large high-definition panel, there is a possibility that one horizontal period is short and the charging time of the pixel is insufficient.

Patent Literature 1 discloses a display device in which the gate wiring is turned on two at a time, and the plurality of pixels arranged in one column is simultaneously charged with two different source wirings (see Japanese laid-open patent publication No. 2020-160254). In addition, Patent Literature 2 discloses a display device in which the gate wiring is turned on four at a time, and the plurality of pixels arranged in one column is simultaneously charged with four different source wirings (see WO2018/130920).

SUMMARY

A display device according to an embodiment of the present invention includes a first pixel, a second pixel, and a third pixel arranged in a first direction in a display area arranged on a first substrate, a first source wiring, a second wiring, and a third wiring extending in the first direction, and connected to each of the first pixel to the third pixel, and a first gate wiring, a second gate wiring, and a third wiring intersecting the first direction, and connected to each of the first pixel to the third pixel. The first pixel includes a first transistor electrically connected to the first gate wiring and the first source wiring and a liquid crystal element electrically connected to the first transistor, the first pixel to the third pixel are arranged between the first source wiring and the third source wiring, and the second source wiring, and the first source wiring intersects the third source wiring.

BRIEF DESCRIPTION OF DRAWINGS

FIG. 12A is a planar layout showing a connection relationship between a gate drive circuit and a gate wiring in a peripheral area.

DESCRIPTION OF EMBODIMENTS

Hereinafter, embodiments of the present invention will be described with reference to the drawings and the like. However, the present invention can be mounted in various aspects without departing from the gist thereof, and is not to be construed as being limited to the description of the embodiments exemplified below. Further, with respect to the drawings, although the width, the thickness, the shape, and the like of each part may be schematically represented in comparison with the actual embodiment in order to clarify the description, the schematic drawings are merely examples, and do not limit the interpretation of the present invention. Further, in the present specification and the drawings, the same or similar elements as those described with respect to the drawings described above are denoted by the same symbols, and redundant description may be omitted. In this specification and the like, ordinal numbers are given for convenience in order to distinguish components, parts, and the like, and do not indicate priority or order.

In the present invention, in the case where a single film is processed to form a plurality of films, the plurality of films may have different functions and roles. However, the plurality of films is derived from films formed as the same layer in the same process, and has the same layer structure and the same material. Therefore, the plurality of films is defined as being present in the same layer. In addition, in the case where a plurality of films is formed by processing a certain film, in the present specification and the like, the films may be described separately as −1, −2, and the like.

In addition, in this specification and the like, expressions such as "upper" and "lower" represent relative positional relationships between a structure of interest and other structures. In the present specification and the like, in a side view, a direction from a first substrate to a pixel electrode, which will be described later, is defined as "upper", and a reverse direction thereof is defined as "lower". In this specification and claims, the expression "on" in describing the manner of arranging another structure on a certain structure shall include both arranging another structure directly above a certain structure and arranging another structure over a certain structure via yet another structure, unless otherwise specified.

In addition, in the present specification and the like, bottom-gate driving is such that on/off of a transistor is controlled by a gate electrode arranged below a semiconductor layer. In addition, in the present specification and the like, top-gate driving is such that on/off of a transistor is controlled by a gate electrode arranged above a semiconductor layer. In addition, in the present specification, dual-gate driving is such that on/off of a transistor is controlled by inputting the same control signal to a gate electrode arranged above and below a semiconductor layer.

First Embodiment

Figure 1:
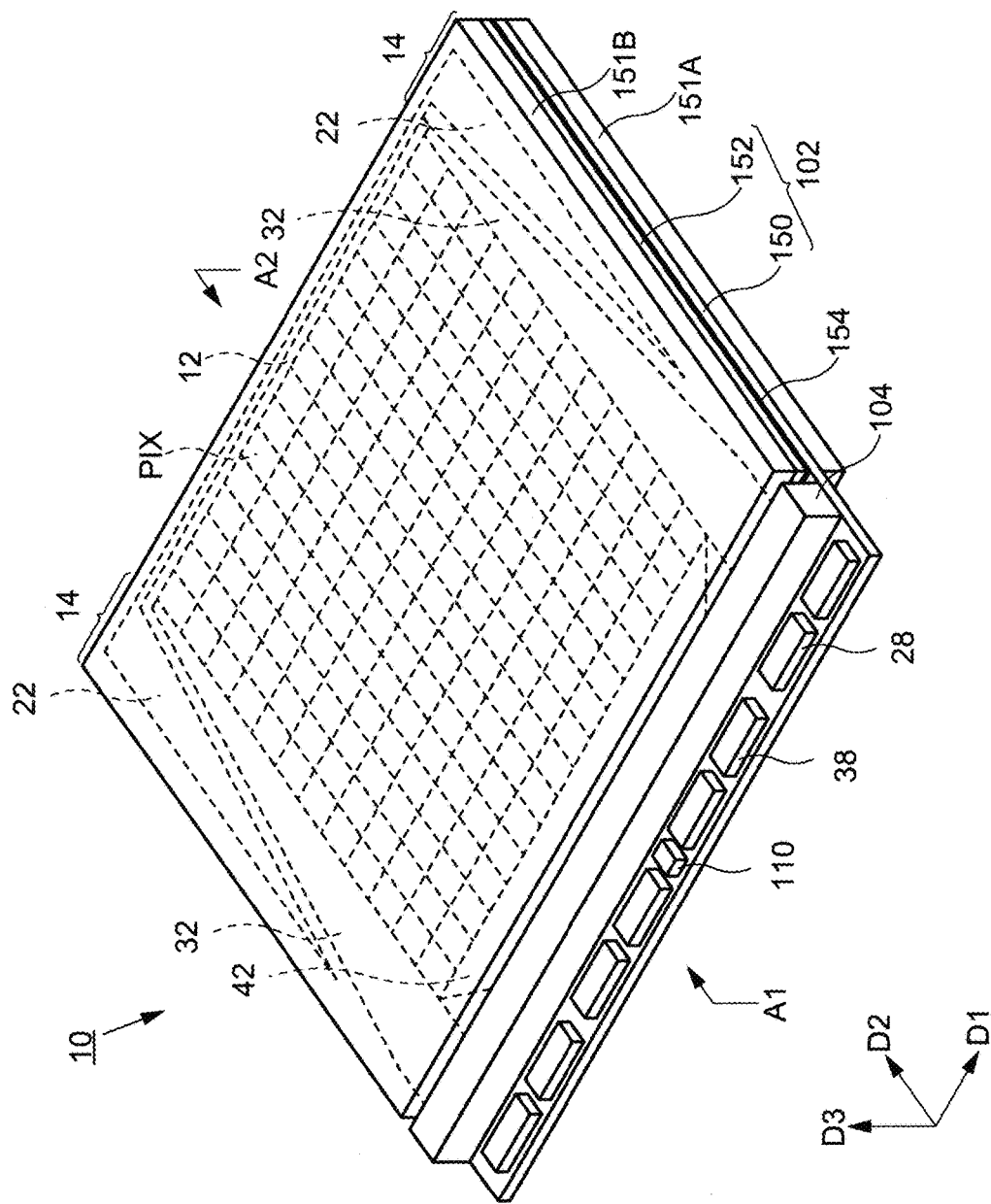
FIG. 1 is a perspective view illustrating an overview of a display device according to an embodiment of the present invention.

A display device 10 according to an embodiment of the present invention will be described with reference to FIG. 1 to FIG. 12C.
[Overview of Display Device]
FIG. 1 is a perspective view of the display device 10 according to an embodiment of the present invention. The display device 10 includes a display panel 102 including an array substrate 150, an opposing substrate 152, a liquid crystal layer between the array substrate 150 and the opposing substrate 152 (not shown), a gate driving circuit 28, and a source driving circuit 38, a light source 104, and a first transparent substrate 151A and a second transparent substrate 151B sandwiching the display panel 102. In the following explanation referring to FIG. 1, one direction of the plane of the display panel 102 is a direction D1, a direction orthogonal to the direction D1 is a direction D2, and a direction orthogonal to the D1-D2 plane is a direction D3.

The array substrate 150 and the opposing substrate 152 have light-transmitting properties. The array substrate 150 and the opposing substrate 152 are preferably transparent to visible light. The opposing substrate 152 is arranged facing the array substrate 150 in the direction D3. The array substrate 150 and the opposing substrate 152 are bonded to each other by a sealing material 154 in a state of being arranged facing each other with a gap therebetween. The liquid crystal layer (not shown) is arranged in a gap between the array substrate 150 and the opposing substrate 152.

The display panel 102 has a display area 12 and a peripheral area 14 outside the display area 12. In the display area 12, a plurality of pixels PIX is arranged in a row direction and a column direction. Here, the row direction refers to a direction parallel to the direction D1, and the column direction refers to a direction parallel to the direction D2. In the display area 12, m pixels are arranged in the row direction, and n pixels are arranged in the column direction. The values of m and n are appropriately set according to a display resolution in the vertical direction and a display resolution in the horizontal direction. In the display area 12, a gate wiring (also referred to as a scan signal line) is arranged in the direction D1, and a source wiring (also referred to as a data signal line) is arranged in the direction D2.

The gate driving circuit 28 and the source driving circuit 38 are arranged in the peripheral area 14 of the array substrate 150. FIG. 1 shows an embodiment in which the gate driving circuit 28 and the source driving circuit 38 are arranged in an integrated circuit (IC) and are mounted in a COG (Chip on Glass) method to the array substrate 150. The gate driving circuit 28 and the source driving circuit 38 are not limited to the embodiments shown in the drawings, and may be mounted by a COF (Chip on Film) method or may be formed by a thin film transistor (TFT) of the array substrate 150.

A gate wiring area 32, a common wiring area 22, and a source wiring area 42 are arranged in the peripheral area 14. The gate wiring area 32 is an area in which a pattern formed by a wiring connecting the gate driving circuit 28 and a gate wiring GL arranged in the display area 12 is arranged. The common wiring area 22 is an area in which a pattern formed by a common wiring is arranged. The common wiring area 22 is used as a wiring for applying a common voltage to a common electrode 218 (see FIG. 5) arranged circuit-wise on the opposing substrate 152. The source wiring area 42 is an area in which a pattern formed by a wiring connecting the source driving circuit 38 and a source wiring SL arranged in the display area 12 is arranged.

The light source 104 has a structure along the direction D1. For example, the light source 104 includes a light emitting diode (LED) arranged along the direction D1. A detailed configuration of the light source 104 is not limited, and may include optical members such as a reflector, a diffuser, and a lens in addition to the light emitting diodes arranged in the direction D1. The light source 104 and a light emission control circuit 110 for controlling the light source 104 may be arranged as separate members independent of the display panel 102, and the light source 104 may be controlled in light emission timing by the light emission control circuit 110 synchronized with the gate driving circuit 28 and the source driving circuit 38. The light emission control circuit 110 for controlling the light source 104 may be arranged as a separate member as well as the light source 104 separately from the display panel 102, may be mounted on the array substrate 150 as an individual component, or may be incorporated in the gate driving circuit 28 or the source driving circuit 38.

The first transparent substrate 151A and the second transparent substrate 151B are arranged so as to sandwich the display area 12 and the peripheral area 14. The first transparent substrate 151A and the second transparent substrate 151B function as protective members of the display panel 102. Further, as described with reference to FIG. 2, the first transparent substrate 151A and the second transparent substrate 151B function as light guide plates for introducing the light emitted from the light source 104 into the display panel 102.

Figure 2:
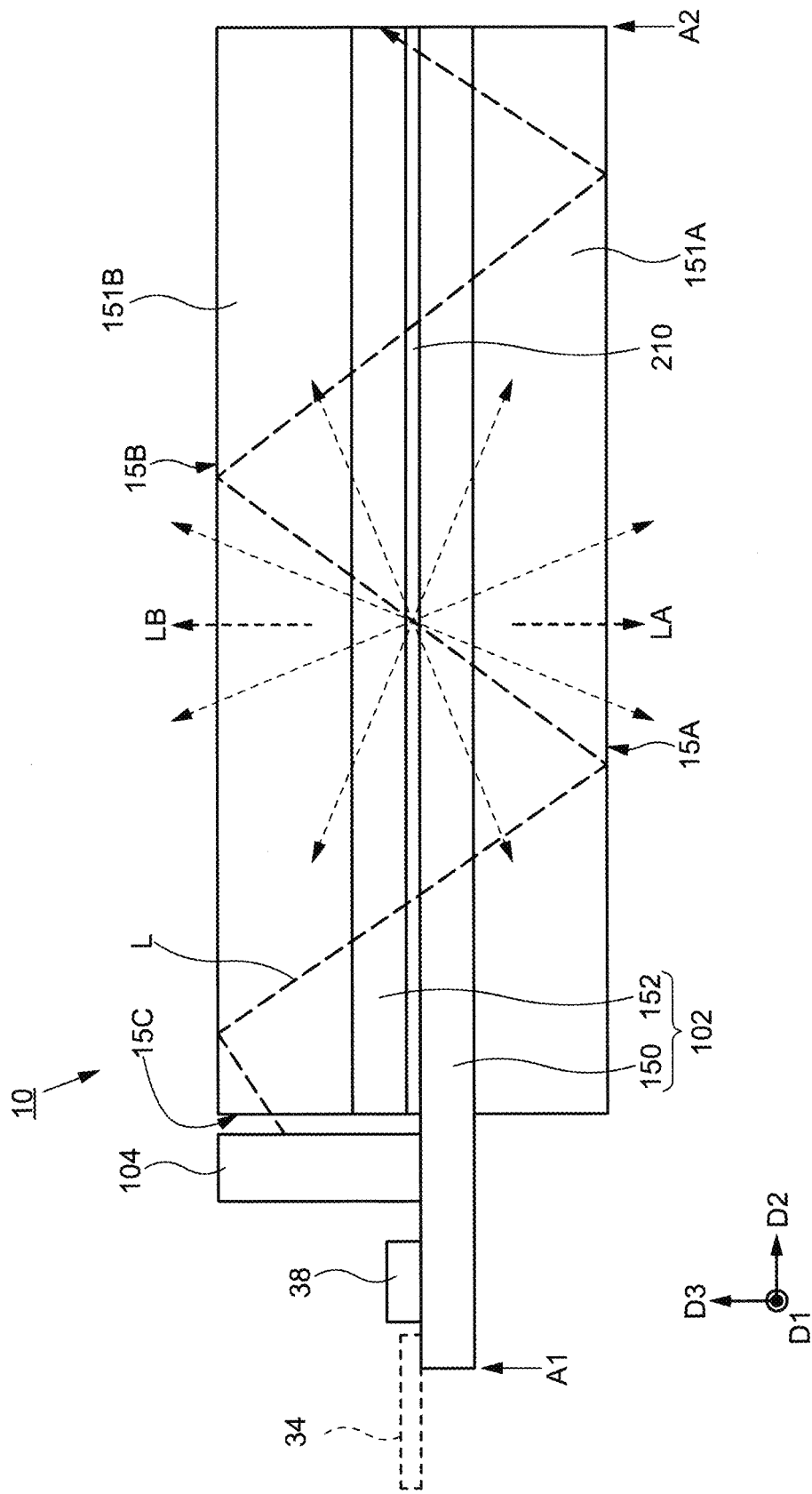
FIG. 2 is a schematic cross-sectional view showing a configuration corresponding to a region between A1-A2 of the display device shown in FIG. 1.

FIG. 2 shows a cross-sectional configuration of the displaying device 10 corresponding to A1-A2 shown in FIG. 1. As shown in FIG. 2, the first transparent substrate 151A is arranged on a side of the array substrate 150 of the display panel 102, and the second transparent substrate 151B is arranged on a side of the opposing substrate 152. A glass substrate or a plastic substrate is used as the first transparent substrate 151A and the second transparent substrate 151B. The first transparent substrate 151A and the second transparent substrate 151B preferably have refractive indexes equivalent to those of the array substrate 150 and the opposing substrate 152. The array substrate 150 and the first transparent substrate 151A, and the opposing substrate 152 and the second transparent substrate 151B are bonded to each other with a transparent adhesive (not shown).

In the display panel 102, the array substrate 150 and the opposing substrate 152 are arranged facing each other, and a liquid crystal layer 210 is arranged therebetween. The array substrate 150 is larger than the opposing substrate 152, and has a size such that part of the peripheral area 14 is exposed from the opposing substrate 152. A driving circuit (source driving circuit 38 in FIG. 2) is mounted on the array substrate 150. A flexible printed circuit 34 is attached to a peripheral portion of the array substrate 150.

The light source 104 is arranged to be adjacent to one side surface of the first transparent substrate 151A or the second transparent substrate 151B. FIG. 2 shows a configuration in which the light source 104 is arranged along one side surface of the second transparent substrate 151B. Further, although FIG. 2 shows a configuration in which the light source 104 is attached to the array substrate 150, the configuration is not limited to the configuration in which the light source 104 is arranged, and the mounting structure is not limited as long as a mounting position can be fixed. For example, the light source 104 may be supported by a housing surrounding the display panel 102.

As shown in FIG. 2, the light source 104 is arranged along a first side surface 15C of the second transparent substrate 151B. As shown in FIG. 2, the light source 104 irradiates the first side surface 15C of the second transparent substrate 151B with a light L. The light source 104 may be referred to as a side light source because it emits the light L toward the first side surface 15C. The first side surface 150 of the second transparent substrate 151B facing the light source 104 serves as a light incidence surface.

As schematically shown in FIG. 2, the light L incident from the first side surface 15C of the second transparent substrate 151B propagates in a direction away from the first side surface 15C (the direction D2) while being reflected by a second plane 15B of the second transparent substrate 151B and a first plane 15A of the first transparent substrate 151A. When the light L is directed to the outside from the first plane 15A of the first transparent substrate 151A and the second plane 15B of the second transparent substrate 151B, the light L proceeds from a medium having a large refractive index to a medium having a small refractive index. In this case, if an incident angle of the light L incident on the first plane 15A and the second plane 15B is larger than a critical angle, the light L is totally reflected, and is guided to the direction D2 while being reflected by the first plane 15A and the second plane 15B.

The liquid crystal layer 210 is formed of a polymer-dispersed liquid crystal. In the liquid crystal layer 210 formed of the polymer-dispersed liquid crystal, a scattering state and a non-scattering state are controlled for each pixel PIX (see FIG. 1). As shown in FIG. 2, in the light L propagating while being reflected by the first plane 15A and the second plane 15B, if there is a pixel in which the liquid crystal layer 210 is in the scattering state, at least a part of the light is scattered, an incident angle of the scattered light becomes an angle smaller than the critical angle, scattered lights LA and LB are respectively emitted to the outside from the first plane 15A and the second plane 15B, and the emitted scattered lights LA and LB are observed by an observer. In the display panel 102, an area other than an area where the scattered lights LA and LB are emitted is substantially transparent because the array substrate 150, the opposing substrate 152, the first transparent substrate 151A, and the second transparent substrate 151B are translucent (transparent to visible light), and the liquid crystal layer 210 is in the non-scattering state, and the observer can visually recognize the back side through the display panel 102.

Figure 3:
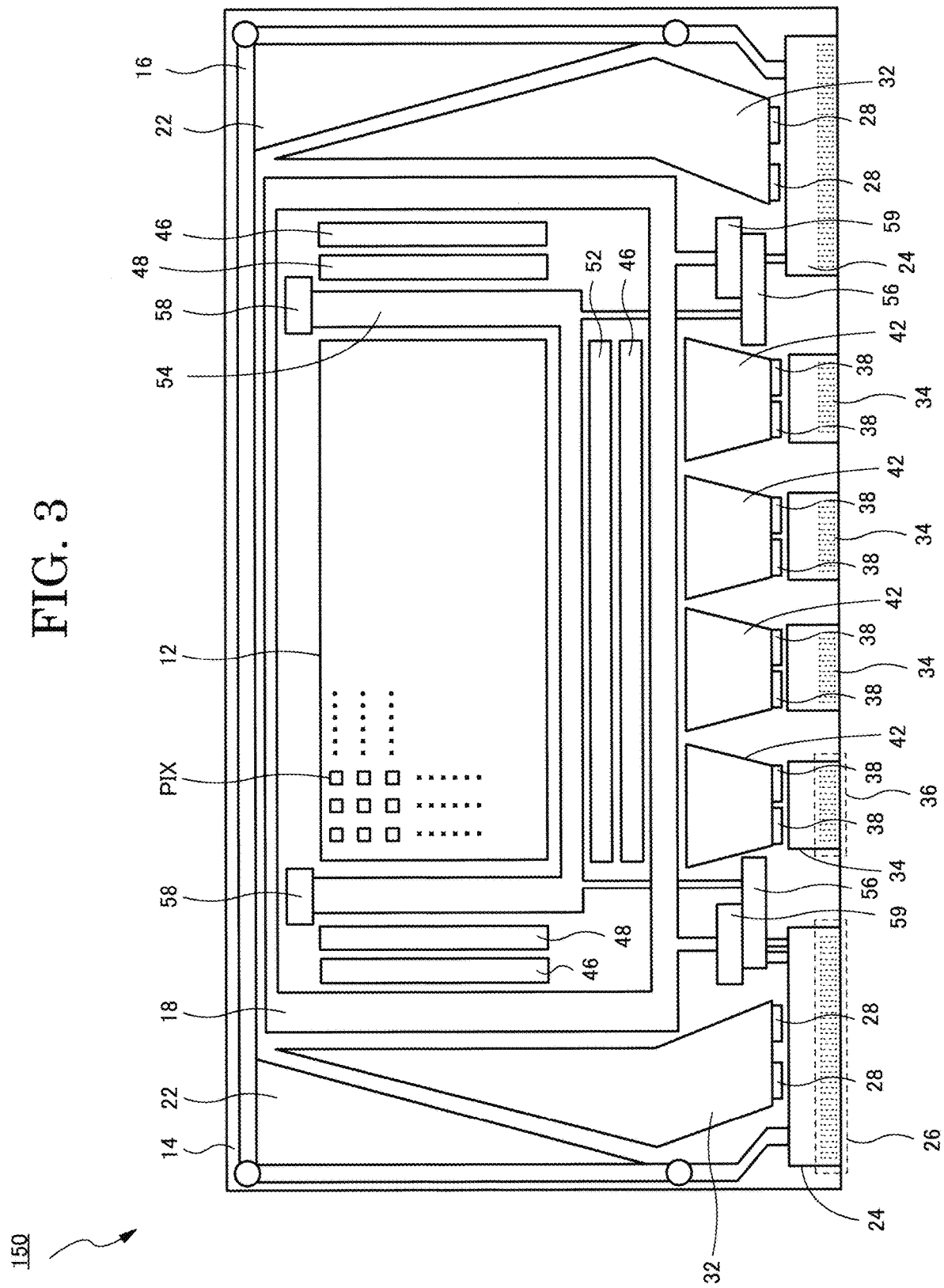
FIG. 3 is a plan view illustrating a configuration of a display device according to an embodiment of the present invention.

FIG. 3 is a plan view showing a configuration of the array substrate 150 of the display device 10 according to the embodiment of the present invention. As shown in FIG. 3, the array substrate 150 includes the display area 12 and the peripheral area 14.

The display area 12 includes the plurality of pixels PIX arranged in a matrix. Each of the plurality of pixels PIX has a plurality of transistors and liquid crystal elements.

The peripheral area 14 is arranged so as to surround the display area 12. In addition, the peripheral area 14 refers to an area from the display area 12 to an end portion of the array substrate 150 in the array substrate 150. In other words, the peripheral area 14 refers to an area other than an area where the display area 12 is arranged on the array substrate 150 (that is, an area outside the display area 12).

In the peripheral area 14, in addition to the gate driving circuit 28 and the source driving circuit 38, the gate wiring area 32, the source wiring area 42, common wirings 16 and 18, terminal parts 26 and 36, flexible printed circuits 24 and 34, and various inspection circuits are arranged. The terminal parts 26 and 36 are arranged along one side of the array substrate 150.

The flexible printed circuit 24 is connected to the terminal part 26. The flexible printed circuit 24 supplies various signals to the gate driving circuit 28, the common wirings 16 and 18, an ESD protection circuit 59 (including a short ring SR), and a QD pad 56. The gate driving circuit 28 is connected to a plurality of gate wirings GL, and each of the plurality of gate wirings GL is electrically connected to each of the plurality of pixels PIX in the display area 12. FIG. 3 represents the area where the plurality of gate wirings GL are arranged as gate wiring region 32, and the detailed arrangement of the plurality of gate wirings GL is omitted from the figure. The number of gate wirings GL connected to two gate driving circuits 28 corresponds to the number of rows of the pixels PIX in the display area 12. In FIG. 3, although the gate wiring area 32 is spaced apart from the display area 12, actually, the gate wiring GL and the pixel PIX are electrically connected to each other.

The flexible printed circuit 34 is connected to the terminal part 36. The flexible printed circuit 34 supplies a video signal to the source driving circuit 38. The source driving circuit 38 is connected to a plurality of source wirings SL, and each of the plurality of source wirings SL is electrically connected to each of the plurality of pixels PIX in the display area 12. FIG. 3 is a representation of an area in which the plurality of source wirings SL is arranged as the source wiring area 42, and a detailed arrangement of the plurality of source wirings SL is omitted in the figure. The number of source wirings SL connected to eight source drive circuits 38 corresponds to at least three times the number of columns of the pixel PIX in the display area 12. In the present embodiment, the case in which the number of source wirings SL is four times the number of columns of the pixel PIX in the display area 12 will be described. In addition, in FIG. 3, although the source wiring area 42 is spaced apart from the display area 12, actually, the source wiring SL and the pixel PIX are electrically connected to each other.

The common wiring 18, an ESD protection circuit 46, a gate inspection circuit 48, and an inspection line 54 are arranged between the gate wiring area 32 and the display area 12. The common wiring 18, the ESD protection circuit 46, a source inspection circuit 52, and the inspection line 54 are arranged between the source wiring area 42 and the display area 12. The inspection line 54 is connected to an ESD protection circuit 58 and the QD pad 56. Furthermore, the common wiring 18 is connected to the ESD protection circuit 59.

The common wiring 16 is arranged so as to surround the peripheral area 14 of the array substrate 150, and signals are supplied from two flexible printed circuits 24. The common wiring 16 is electrically connected to the mesh-shaped common wiring area 22.

The display device 10 is not limited to a high speed drive panel such as the transparent display shown in FIG. 1 and FIG. 2. The display device 10 can be applied to a large high-definition panel used in a display device that is not a transparent display.

[Configuration of Pixel]

Figure 4:
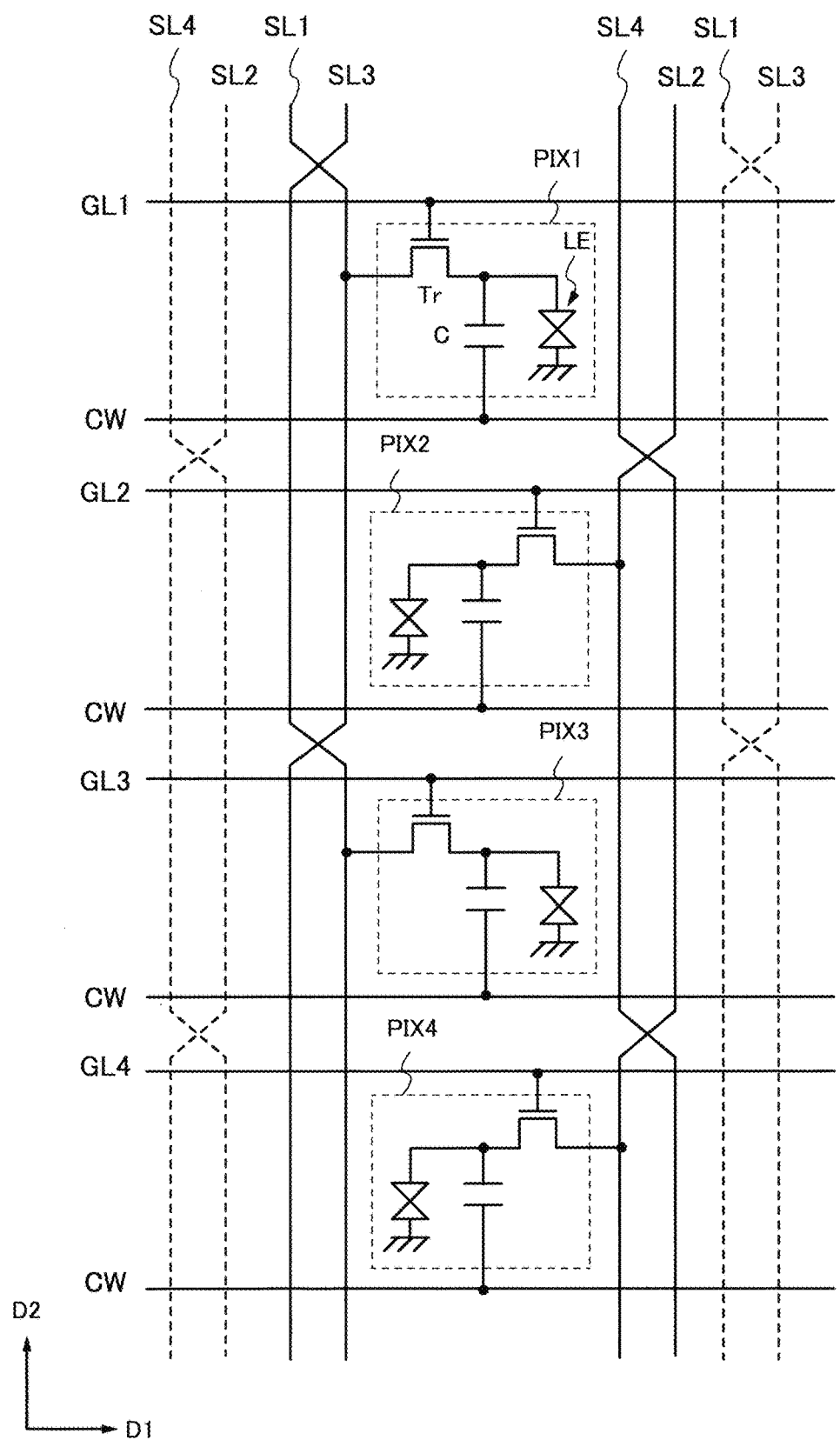
FIG. 4 is a block diagram showing a pixel in a display device according to an embodiment of the present invention.

FIG. 4 is a diagram illustrating a configuration of the pixel PIX included in the display device 10 according to an embodiment of the present invention. In the present embodiment, the display device 10 in which an on-voltage is simultaneously supplied to four gate wirings and four pixels arranged in the column direction can be simultaneously charged by four source wirings will be described. As a result, one horizontal period can be longer than a horizontal period in line order. In other words, it is possible to reduce the time required for scanning all the pixel lines arranged in the display area 12 to one-quarter. Therefore, a charging period of the pixel can be sufficiently secured in the high-speed driving panel such as a transparent display or a large high-definition panel. Hereinafter, a configuration of the pixel according to the present embodiment will be described in detail.

In FIG. 4, four pixels PIX1 to PIX4 are arranged in the column direction (the direction D2). Each of the four pixels PIX1 to PIX4 is electrically connected to each of the four gate wirings GL1 to GL4. In addition, each of the four pixels PIX1 to PIX4 is electrically connected to each of the four wirings SL1 to SL4. Each of the four pixels PIX1 to PIX4 is connected to a capacitance wiring CW. In the following explanation, if the pixels PIX1 to PIX4 are not distinguished from each other, they will be described as the pixel PIX. If the gate wirings GL1 to GL4 and the source wirings SL1 to SL4 are not distinguished, they will be described as the gate wiring GL and the source wiring SL.

The pixel PIX includes a transistor Tr, a liquid crystal element LE, and a holding capacitance C. A gate of the transistor Tr is connected to the gate wiring GL, a source of the transistor Tr is connected to the source wiring SL, and a drain of the transistor Tr is connected to one electrode of the liquid crystal element LE and one electrode of the holding capacitance C. The other electrode of the liquid crystal element LE is connected to the common wiring. The other electrode of the holding capacitance C is connected to the capacitance wiring CW.

The transistor Tr has a function of controlling a time to write the video signal supplied from the source wiring to the pixel by switching between the on-state and the off-state. Turning on the transistor Tr makes it possible to write a potential corresponding to the video signal supplied from the source wiring to the holding capacitance C electrically connected to the transistor Tr. In addition, turning off the transistor Tr makes it possible to hold the potential held in the holding capacitance C.

Figure 5:
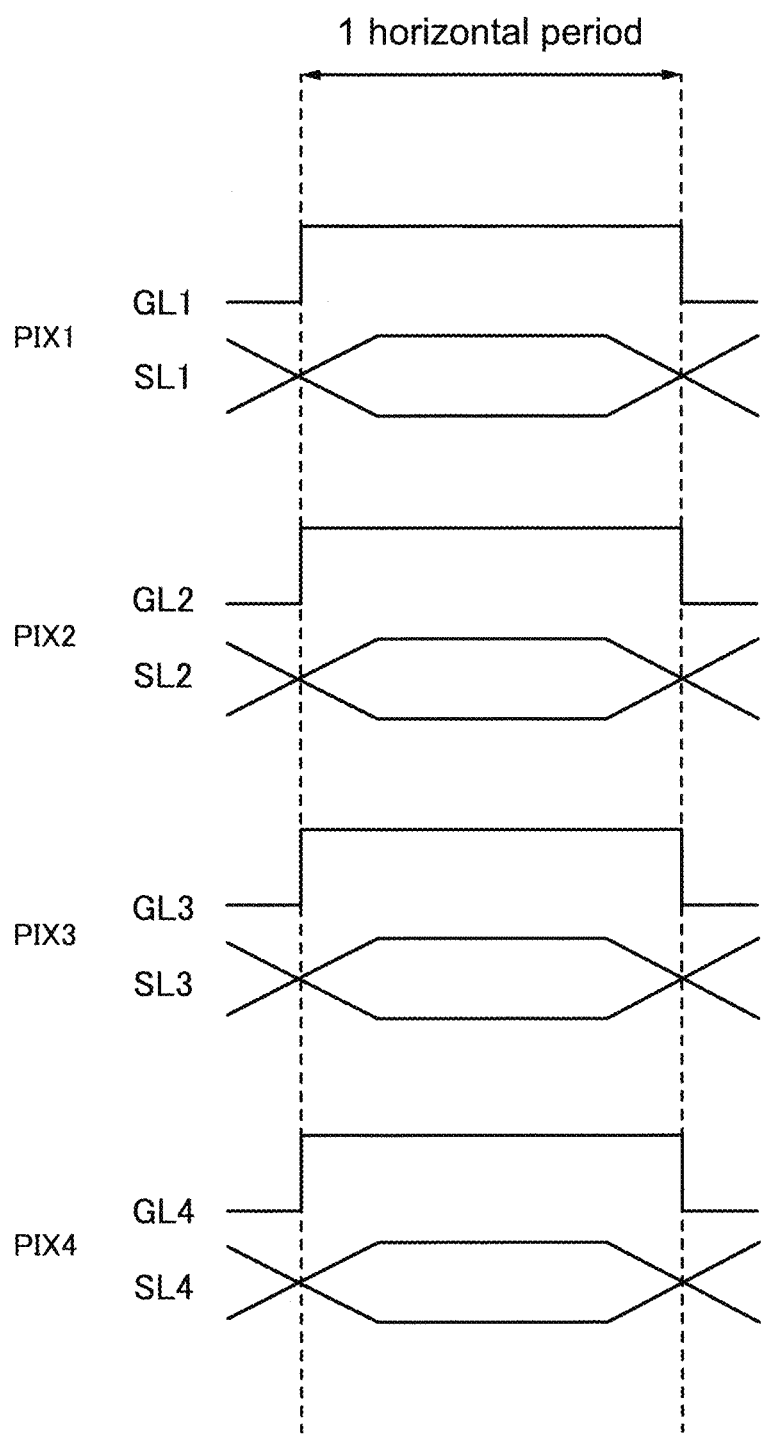
FIG. 5 is a timing chart of a pixel in a display device according to an embodiment of the present invention.

FIG. 5 is a timing diagram of the display device 10 according to an embodiment of the present invention. Normally, the on-voltage is supplied one row at a time, and then the gate wiring GL sequentially charges the pixel columns arranged in the direction D2 using the same source wiring. On the other hand, in the present embodiment, the on-voltage is simultaneously supplied to the four gates wirings GL, so that the transistors Tr of the four pixels are simultaneously turned on. In this state, the video signal is simultaneously supplied to the different source wirings SL1 to SL4. This makes it possible to simultaneously drive the four pixels arranged in the direction D2.

As shown in FIG. 4, the source wiring SL1 and the source wiring SL3, the source wiring SL2 and the source wiring SL4 are arranged so as to sandwich one column of pixels. In other words, the four source wirings SL1 to SL4 are arranged between one column of pixels and one column of pixels.

The source wiring SL1 and the source wiring SL3 have an intersecting area. In addition, the source wiring SL2 and the source wiring SL4 have an intersecting area. In other words, the source wiring SL1 and the source wiring SL3 are interchanged, and the source wiring SL2 and the source wiring SL4 are interchanged. As a result, resistance of the source wirings SL1 to SL4 and the uniformity of the capacitance can be achieved. In addition, it is possible to suppress a defect caused by static electricity at the time of manufacturing the display panel or the like. This reason will be described with reference to FIG. 7 to FIG. 10.

[Cross-Sectional Configuration of Pixel]

Figure 6:
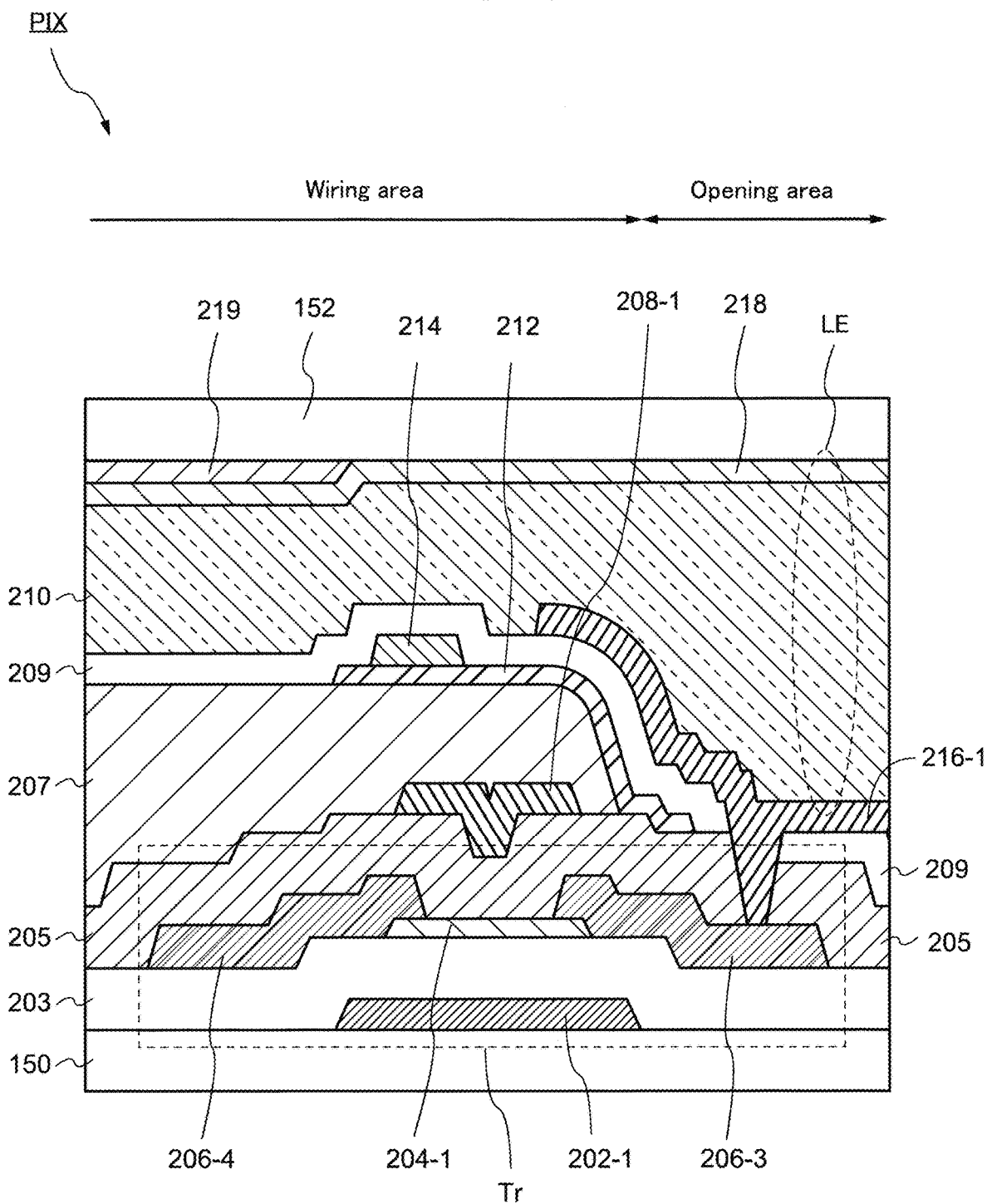
FIG. 6 is a cross-sectional view of a pixel in a display device according to an embodiment of the present invention.

A configuration of the display device 10 according to an embodiment of the present invention will be described with reference to FIG. 6. FIG. 6 is a cross-sectional view of the pixel PIX in the display device 10 according to an embodiment of the present invention.

As shown in FIG. 6, the transistor Tr is arranged on the array substrate 150. The transistor Tr includes a conductive layer 202-1 arranged on the array substrate 150, an oxide semiconductor layer 204-1 arranged opposite the conductive layer 202-1, a gate insulating film 203 arranged between the conductive layer 202-1 and the oxide semiconductor layer 204-1, and a conductive layer 206-3 and a conductive layer 206-4 arranged on the oxide semiconductor layer 204-1. In this case, the conductive layer 202-1 functions as the gate wiring GL (gate electrode), and the conductive layer 206-4 functions as the source wiring SL (source electrode).

An insulating film 205 is arranged on the transistor Tr. In addition, on the insulating film 205, a conductive layer 208-1 is arranged at a position opposite the oxide semiconductor layer 204-1. The conductive layer 208-1 functions as a back gate electrode. In the present embodiment, the transistor Tr is described as a bottom-gate drive transistor, but the present invention is not limited to this, and may be a top-gate drive transistor or a dual-gate drive transistor.

A planarization film 207 is arranged on the conductive layer 208-1 and an insulating layer 105. The planarization film 207 is arranged to release unevenness of various wirings constituting the transistor Tr. In the case where the display device 10 is applied to a transparent display, the planarization film 207 is preferably removed at an opening area of the pixel PIX. This makes it possible to suppress the planarization film 207 from absorbing light in the opening area.

A transparent conductive layer 212 is arranged above the planarization film 207 and the insulating film 205. A conductive layer 214 is arranged above the transparent conductive layer 212. The transparent conductive layer 212 and the conductive layer 214 function as the capacitance wiring. An insulating film 209 is arranged above the transparent conductive layer 212 and the conductive layer 214. A pixel electrode 216-1 is arranged above the insulating film 209. The pixel electrode 216-1 is connected to the conductive layer 206-3 via the openings arranged in the insulating films 205 and 209.

The counter substrate 152 is arranged to face the array substrate 150. A light-shielding layer 219 and the common electrode 218 are arranged in the counter substrate 152. The light-shielding layer 219 functions as a black matrix. In a configuration shown in FIG. 6, the light-shielding layer 219 is arranged in an area overlapping the conductive layer 206-4. The light-shielding layer 219 is arranged in a lattice pattern so as to cover the gate wiring GL and the source wiring SL1 to the source wiring SL4. The common electrode 218 has a size extending over the entire surface of a display area 112. The light-shielding layer 219 may be formed of a metal film and functions as an auxiliary electrode by being arranged in contact with the common electrode 218 formed of a transparent conductive film. The liquid crystal layer 210 is arranged between the array substrate 150 and the counter substrate 152, and sealed with a sealing material 154 (see FIG. 1). The pixel electrode 216-1, the liquid crystal layer 210, and the common electrode 218 constitute the liquid crystal element LE.

[Planar Layout of Pixel]

A planar layout of the pixel PIX of the display device 10 will be described with reference to FIG. 7 to FIG. 10. In FIG. 7 to FIG. 10, configurations of the area where the source wiring SL1 and the source wiring SL3 intersect and the area where the source wiring SL2 and the source wiring SL4 intersect will be described in detail. FIG. 7 to FIG. 10 show a plan view of configurations of PIX-A1, PIX-A2, PIX-B1, and PIX-B2.

Figure 7:
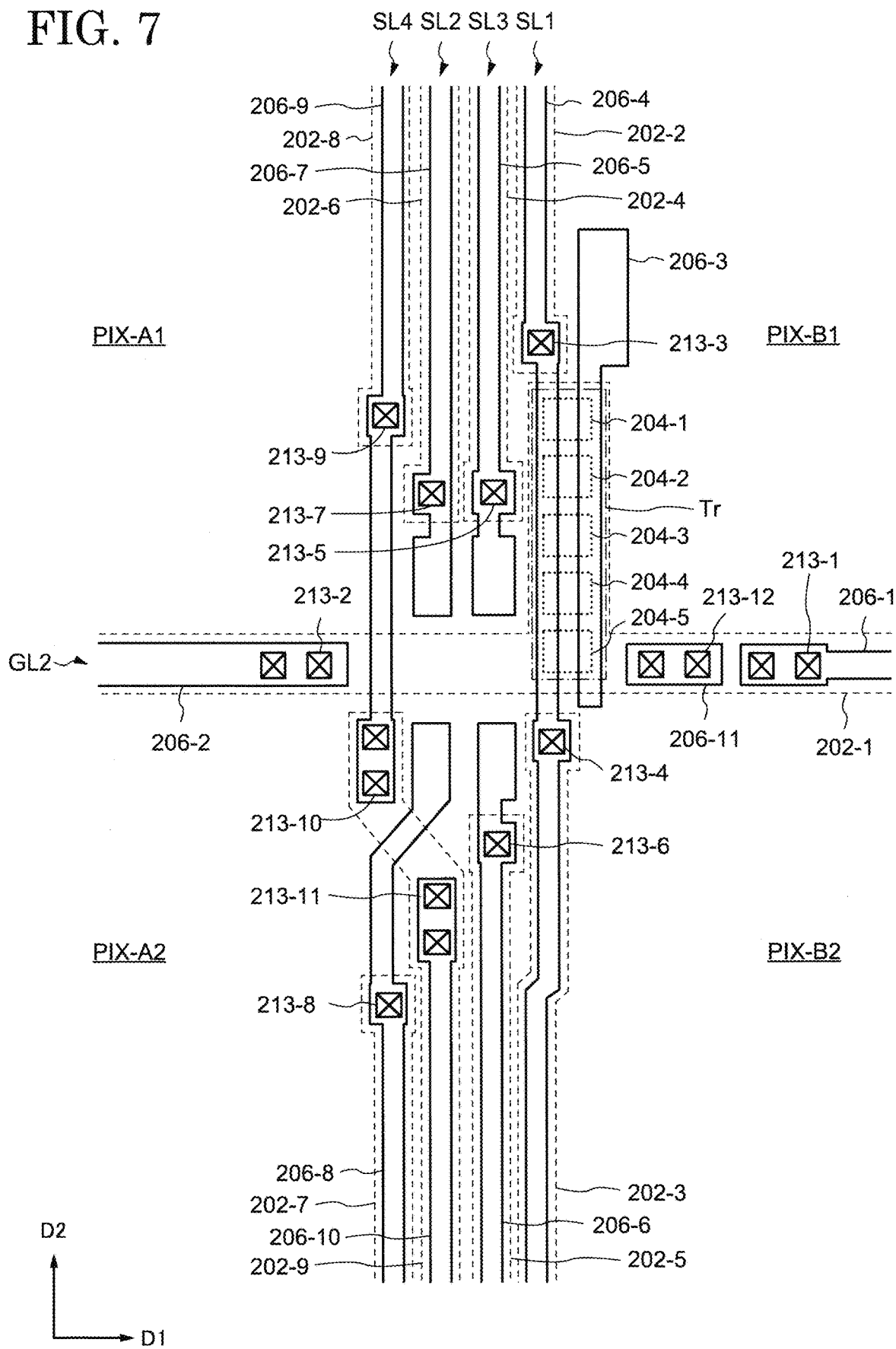
FIG. 7 is a planar layout of a pixel in a display device according to an embodiment of the present invention.

FIG. 7 is a planar layout of the conductive layers 202-1 to 202-9, the oxide semiconductor layers 204-1 to 204-5, and conductive layers 206-1 to 206-11. The conductive layers 202-1 to 202-9 are arranged on the array substrate 150. The conductive layer 202-1 extends in the direction D1 but has an area branched in the direction D2. In addition, the conductive layers 202-2 to 202-9 extend in the direction D2. The oxide semiconductor layers 204-1 to 204-5 are arranged on the conductive layer 202-1 via the gate insulating film 203 (see FIG. 6). The oxide semiconductor layers 204-1 to 204-5 are arranged side by side in the direction D2. In the present embodiment, an example in which the transistor Tr is formed using five oxide semiconductor layers 204-1 to 204-5 will be shown. The effect of heat generation on the oxide semiconductor layers can be reduced by being separately arranged in a plurality of layers. The number of oxide semiconductor layers is not particularly limited. The light passing through a glass substrate (array substrate) 101 from the conductive layer 202-1 toward the oxide semiconductor layers 204-1 to 204-5 guided by the conductive layer 202-1 is reflected on the oxide semiconductor layers 204-1 to 204-5, and light leakage is less likely to occur in the oxide semiconductor layers 204-1 to 204-5. The conductive layers 206-1 to 206-11 are arranged on the gate insulating film and the oxide semiconductor layers 204-1 to 204-5. The conductive layers 206-1, 206-2, and 206-11 extend in the direction D1 and the conductive layers 206-3 to 206-10 extend in the direction D2.

The conductive layer 202-1 overlaps the conductive layers 206-1, 206-2, and 206-11. The conductive layer 202-1 is connected to the conductive layer 206-1 via an opening 213-1 arranged in the gate insulating film 203, and is connected to the conductive layer 206-2 via an opening 213-2 arranged in the gate insulating film 203. An area in the conductive layer 202-1, which extends in the direction D1, functions as a gate wiring. In addition, and area in the conductive layer 202-1, which extends in the direction D2, functions as a gate electrode.

The conductive layers 202-2 and 202-3 overlap the conductive layer 206-4. The conductive layer 202-2 is connected to the conductive layer 206-4 via an opening 213-3 arranged in the gate insulating film 203, and the conductive layer 202-3 is connected to the conductive layer 206-4 via an opening 213-4 arranged in the gate insulating film 203. The conductive layer 206-4 intersects the conductive layer 202-1. The conductive layer 206-4 functions as a first source wiring SL1. In addition, in the conductive layer 206-4, an area that does not overlap the conductive layers 202-2 and 202-3 functions as a source electrode of the transistor Tr. The conductive layer 206-3 functions as a drain electrode of the transistor Tr.

The conductive layer 202-4 overlaps a conductive layer 206-5 and is connected to the conductive layer 206-5 via an opening 213-5 arranged in the gate insulating film 203. The conductive layer 202-5 overlaps a conductive layer 206-6 and is connected to the conductive layer 206-6 via an opening 213-6 arranged in the gate insulating film 203. The conductive layer 206-5 is connected to the conductive layer 206-6 via a conductive layer 208-2 (see FIG. 8). As a result, the conductive layer 206-5, the conductive layer 206-6, and the conductive layer 208-2 function as the third source wiring SL3.

The conductive layer 202-6 overlaps the conductive layer 206-7 and is connected to the conductive layer 206-7 via an opening 213-7 arranged in the gate insulating film 203. The conductive layer 202-7 overlaps the conductive layer 206-8 and is connected to the conductive layer 206-8 via an opening 213-8 arranged in the gate insulating film 203. The conductive layer 206-7 is connected to the conductive layer 206-8 via a conductive layer 208-3 (see FIG. 8). The conductive layer 206-7, the conductive layer 206-8, and the conductive layer 208-3 function as the second source wiring SL2.

The conductive layer 202-8 overlaps the conductive layer 206-9 and is connected to the conductive layer 206-9 via an opening 213-9 arranged in the gate insulating film 203. The conductive layer 202-9 overlaps the conductive layer 206-9 and the conductive layer 206-10. The conductive layer 202-9 is connected to the conductive layer 206-9 via an opening 213-10 arranged in the gate insulating film 203. The conductive layer 202-9 is connected to the conductive layer 206-10 via an opening 213-11 arranged in the gate insulating film 203. The conductive layer 206-9 has an area that intersects the conductive layer 202-1. The conductive layer 206-9 and the conductive layer 206-10 function as the fourth source wiring SL4.

In addition, the conductive layer 202-1 overlaps the conductive layer 206-11 and is connected to the conductive layer 206-11 via an opening 213-12 arranged in the gate insulating film 203.

The conductive layer 202-9 and the conductive layer 206-8 have a bent area. The conductive layer 202-9 has an area that overlaps and intersects the conductive layer 206-8. That is, there is an area where the second source wiring SL2 and the fourth source wiring SL4 intersect.

Although not shown, the conductive layer 202-2 and the conductive layer 206-5 have a bent area. The conductive layer 202-2 has an area that overlaps and intersects the conductive layer 206-5. That is, the first source wiring SL1 has an area that intersects the third source wiring SL3.

As shown in FIG. 7, the gate wiring GL is formed by stacking the conductive layer 202-1 and the conductive layers 206-1 and 206-2. In addition, in the gate wiring GL, only the conductive layer 202-1 is arranged in the area that intersects the source wiring SL1 to the source wiring SL4, and the conductive layer 206-1 and the conductive layer 206-2 are separately arranged. In addition, the source wiring SL1 is formed by stacking the conductive layers 202-2 and 202-3 and the conductive layer 206-4. In addition, in the source wiring SL1, only the conductive layer 206-4 is arranged in the area that intersects the gate wiring GL, and the conductive layer 202-2 and the conductive layer 202-3 are separately arranged. As a result, even if static electricity is generated in the manufacturing process of the display area 12 and the peripheral area 14 in the array substrate 101, the static electricity can be released, so that the occurrence of defects caused by static electricity can be suppressed.

Figure 8:
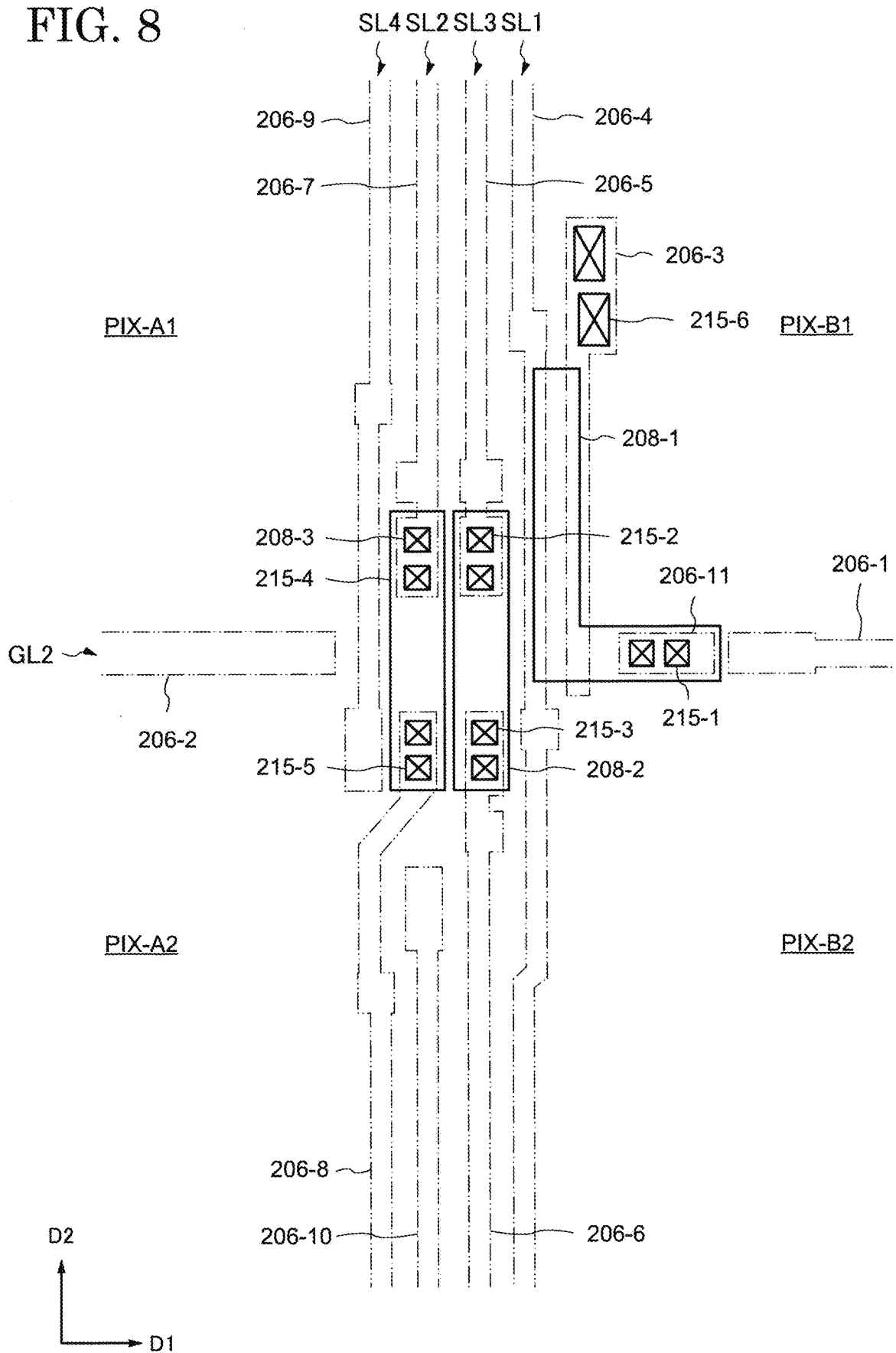
FIG. 8 is a planar layout of a pixel in a display device according to an embodiment of the present invention.

FIG. 8 is a planar layout of the conductive layers 206-1 to 206-11 and the conductive layers 208-1 to 208-3. The conductive layers 206-1 to 206-11 are as described in FIG. 7. The conductive layers 208-1 to 208-3 are arranged on the insulating film 205 (see FIG. 6). The conductive layer 208-1 has an area extending in the direction D2 and an area extending in the direction D1. The area extending in the direction D2 overlaps the oxide semiconductor layers 204-1 to 204-5. In addition, an area extending in the direction D1 overlaps the conductive layer 206-11 and is connected to the conductive layer 206-11 via an opening 215-1 arranged in the insulating film 205. The conductive layer 208-2 extends in the direction D2. The conductive layer 208-2 overlaps the conductive layer 206-5 and the conductive layer 206-6, and is connected to the conductive layer 206-5 and the conductive layer 206-6 via openings 215-2 and 215-3 arranged in the insulating film 205. The conductive layer 208-3 extends in the direction D2. The conductive layer 208-3 overlaps the conductive layer 206-7 and the conductive layer 206-8, and is connected to the conductive layer 206-7 and the conductive layer 206-8 via openings 215-4 and 215-5 arranged in the insulating film 205.

Figure 9:
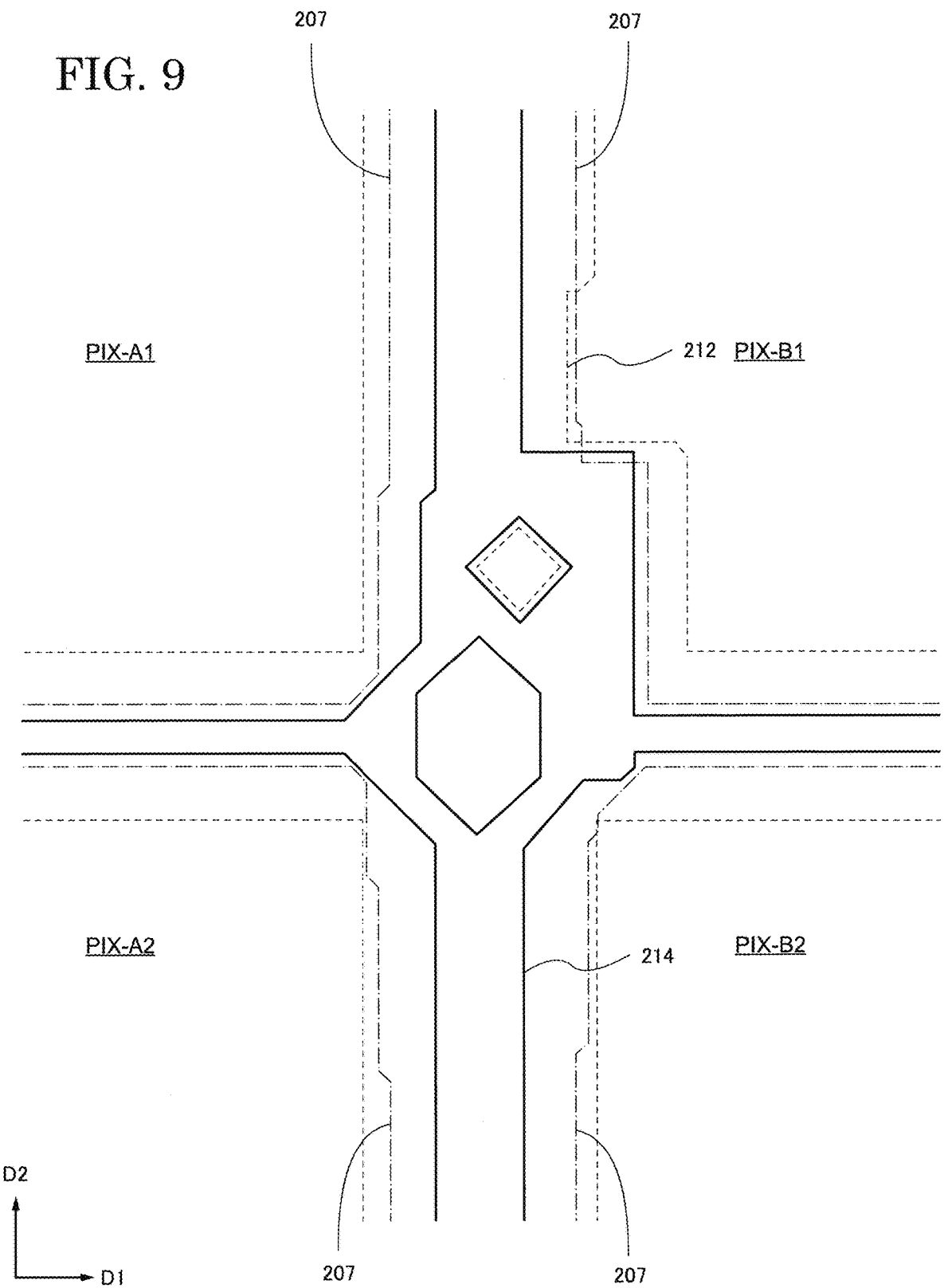
FIG. 9 is a planar layout of a pixel in a display device according to an embodiment of the present invention.

FIG. 9 is a planar layout of the planarization film 207, the transparent conductive layer 212, and the conductive layer 214. The planarization film 207 is removed at an opening area of the pixels PIX1 to PIX4 as described above. That is, the planarization film 207 is arranged on the wiring area. The transparent conductive layer 212 is arranged above the planarization film 207. In addition, the conductive layer 214 is arranged above the transparent conductive layer 212. The transparent conductive layer 212 and the conductive layer 214 function as capacitance wirings. The transparent conductive layer 212 is arranged above the conductive layers 206-1 to 206-11 via the planarization film 207. Therefore, since the source wirings SL1 to SL4 and the capacitance wiring CW are arranged so as to be separated from each other, it is less likely to be affected by the potential from the capacitance wiring CW. In addition, the electrical resistance of the conductive layer 214 is smaller than the electrical resistance of the transparent conductive layer 212. Therefore, variation in the potential of the capacitance wiring CW due to the position where the pixel PIX is located in the display area 12 is suppressed.

The transparent conductive layer 212 and the conductive layer 214 are arranged in a lattice pattern so as to cover the gate wiring GL and the source wirings SL1 to SL4. As a result, the holding capacitance C between the area where the transparent conductive layer 212 is not arranged and the pixel electrode 216 is reduced. The holding capacitance C is adjusted according to a size of the area where the transparent conductive layer 212 is not arranged. In addition, the transparent conductive layer 212 may be arranged on the entire surface instead of being arranged in the lattice pattern. In addition, the conductive layer 214 is arranged so as to cover the transistor Tr. As a result, the light leakage of the transistor Tr can be suppressed.

Although an example in which the conductive layer 214 is arranged above the transparent conductive layer 212 is shown, the conductive layer 214 may be arranged below the transparent conductive layer 212. The conductive layer 214 may be stacked with the transparent conductive layer 212. The conductive layer 214 has a light-shielding property. Therefore, the wiring area can be shielded from light. In a plan view, the conductive layer 214 is arranged such that a width thereof is larger than a width obtained by combining the source wirings SL1 to SL4. In addition, in a plan view, the conductive layer 214 is arranged such that a width thereof is larger than a width of the gate wiring GL. As a result, it is possible to suppress a display panel 11 from emitting the reflected light reflected by edges of the source wirings SL1 to SL4. The width of the conductive layer 214 and the width obtained by combining the source wirings SL1 to SL4 refer to lengths in the direction (the direction D1) intersecting the direction in which the source wirings SL1 to SL4 extend. In addition, the width of the gate wiring GL refers to a length in the direction (direction D2) intersecting the direction in which the gate wiring GL extends.

Figure 10:
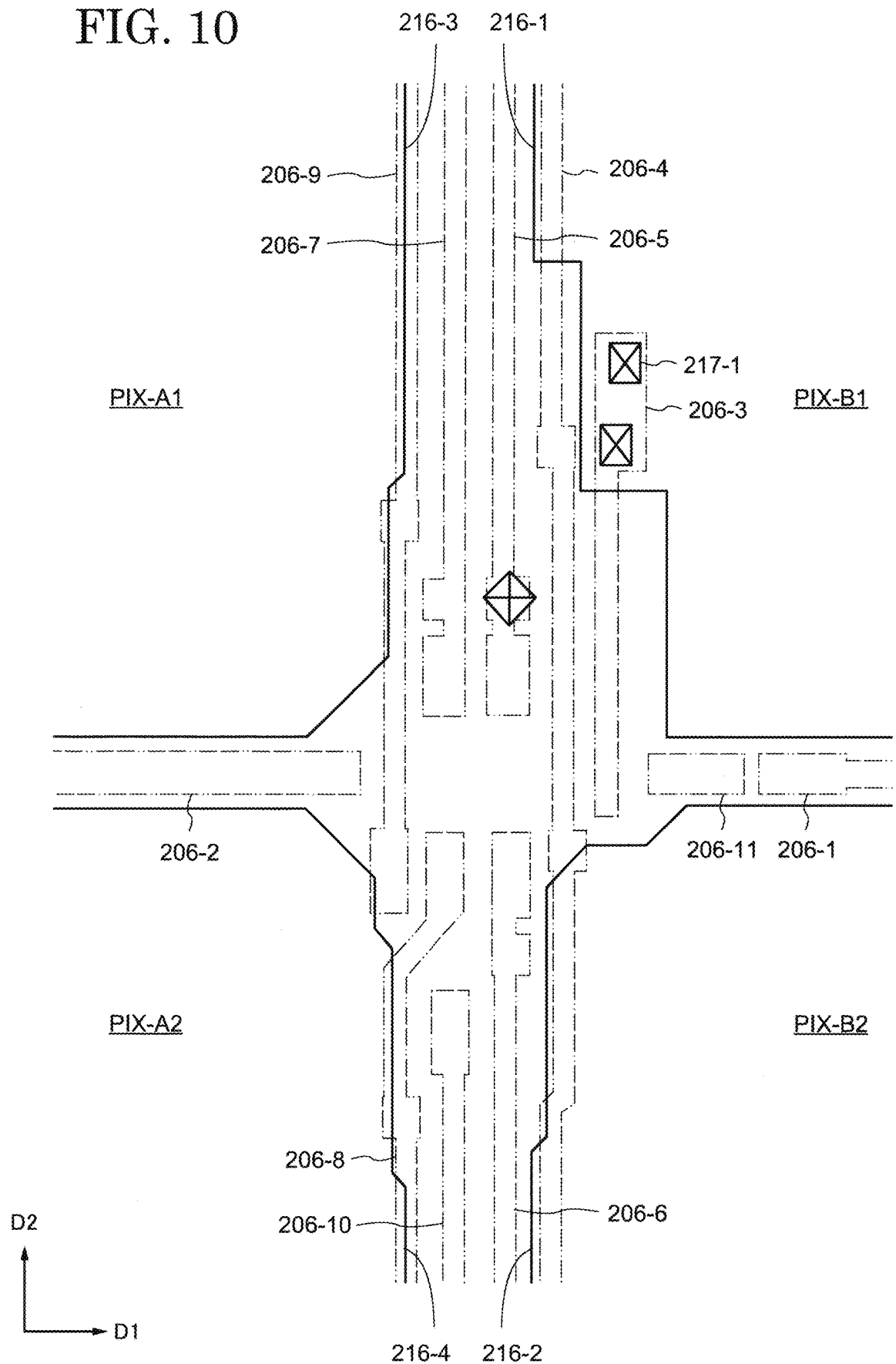
FIG. 10 is a planar layout of a pixel in a display device according to an embodiment of the present invention.

FIG. 10 is a planar layout of the conductive layers 206-1 to 206-11 and the pixel electrodes 216-1 to 216-4. The conductive layers 206-1 to 206-11 are as described in FIG. 7. The pixel electrodes 216-1 to 216-4 are arranged above the insulating film 209. The pixel electrodes 216-1 to 216-4 are arranged in the opening area of the pixel PIX. The pixel electrode 216-1 is connected to the conductive layer 206-3 via an opening 217-1 arranged in the insulating film 209 and an opening 215-6 (see FIG. 8) arranged in the insulating film 205.

As described above, in the display area 12, the conductive layer 202 and the conductive layer 206 are arranged so as to be stacked and extend as the gate wirings GL1 to GL4 and the source wirings SL1 to SL4. Arranging the gate wirings GL1 to GL4 by stacking and extending the conductive layer 202 and the conductive layer 206 makes it possible to uniformize the resistance of the gate wirings GL1 to GL4 and uniformize the wiring capacitance. Arranging the source wirings SL1 to SL4 by stacking and extending the conductive layer 202 and the conductive layer 206 makes it possible to uniformize the resistance of the source wirings SL1 to SL4 and uniformize the wiring capacitance. In addition, the source wiring SL1 and the source wiring SL3 may be arranged to intersect with each other, and the source wiring SL2 and the source wiring SL4 may be arranged to intersect with each other.

[Materials of Each Member of Display Device 10]

A rigid substrate having light translucency and not flexibility such as a glass substrate, a quartz substrate, and a sapphire substrate can be used as the array substrate 150 and the counter substrate 152. On the other hand, in the case where the array substrate 150 and the counter substrate 152 need to have flexibility, a flexible substrate containing a resin and having flexibility such as a polyimide substrate, an acryl substrate, a siloxane substrate, or a fluororesin substrate can be used as the array substrate 150 and the counter substrate 152. In order to improve the heat resistance of the array substrate 150 and the counter substrate 152, impurities may be introduced into the resin. In addition, in the case where the display device 10 is applied to a transparent display or a large high-definition display, it is preferable to use a glass substrate as the array substrate 150 and the counter substrate 152. In addition, the first transparent substrate 151A and the second transparent substrate 151B are arranged to protect the array substrate 150 and the counter substrate 152. Therefore, for example, it is preferable to use a glass substrate having a light transmittance, a plastic substrate, or the like.

A general metal material can be used as the conductive layer 202, the conductive layer 206, the conductive layer 208, and the conductive layer 214. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and alloys or compounds thereof are used as these members. The material described above may be used in a single layer or in a stacked layer as the member described above. For example, stacked layers of Al\Ti are used as the conductive layers 202. For example, stacked layers of TiN\Ti\Al\Ti\TiN are used as the conductive layer 206. For example, Mo is used as the conductive layer 208. A laminated structure of Mo\Al is used as the fourth conductive layer.

Common insulating materials can be used as the gate insulating film 203, the insulating film 205, and the insulating film 209. For example, an inorganic insulating layer such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) can be used as the gate insulating film 203, the insulating film 205, and the insulating film 209. An insulating layer with few defects can be used as these insulating layers. An organic insulating material such as a polyimide resin, an acryl resin, an epoxy resin, a silicone resin, a fluororesin, or a siloxane resin can be used as the planarization film 207. In addition, the organic insulating materials described above may be used as the gate insulating film 203, the insulating film 205, and the insulating film 209. The above-described material may be used in a single layer or in a stacked layer as the members described above. For example, a stacked structure of silicon nitride and silicon oxide is used as the gate insulating film 203. For example, a stacked structure of silicon oxide and silicon nitride is used as the insulating film 205. In addition, silicon nitride is used as the insulating film 209.

$SiO_xN_y$ and $AlO_xN_y$ are silicon compounds and aluminum compounds containing nitrogen (N) in a ratio (x>y) smaller than that of oxygen (O). In addition, $SiN_xO_y$ and $AlN_xO_y$ are silicon compounds and aluminum compounds containing oxygen in a ratio (x>y) smaller than that of nitrogen.

A metal oxide having semiconducting properties can be used as the oxide semiconductor layer 204. The oxide semiconductor layer 204 has light transmittance. For example, an oxide semiconductor containing indium (In), gallium (Ga), zinc (Zn), and oxygen (O) can be used. In particular, an oxide semiconductor having a composition ratio of In:Ga:Zn:O=1:1:1:4 can be used. However, the oxide semiconductor containing In, Ga, Zn and O used in the present embodiment is not limited to the above-described composition, and an oxide semiconductor having a composition other than the above can also be used. For example, the ratio of In may be larger than the above in order to improve the mobility. In addition, the ratio of Ga may be larger than the above in order to increase a bandgap and reduce the influence of light irradiation.

In the present embodiment, although an example in which an oxide semiconductor layer is used as the semiconductor layer has been described, a semiconductor layer using amorphous silicon or polysilicon may be used.

A mixture of indium oxide and tin oxide (ITO) and a mixture of indium oxide and zinc oxide (IZO) can be used as the transparent conductive layer 212, the pixel electrode 216, and the common electrode 218. Materials other than the above may be used as the transparent conductive layer. The light-shielding layer 219 used in a black matrix BM may be formed of a black plastic or metal material. The black matrix BM is formed in contact with the common electrode 218 (see FIG. 6). Forming the black matrix BM with the metal material with respect to the common electrode 218 formed from a transparent conductive film makes it possible to have a function as an auxiliary electrode for reducing resistance loss. A material having a relatively low reflectance for aluminum such as chrome, molybdenum, and titanium is preferably used as the metal material forming the black matrix BM.

A polymer-dispersed liquid crystal is preferably used as the liquid crystal layer 210 in the case where the display device 10 is applied to a transparent display. The polymer-dispersed liquid crystal includes bulk and fine particles. An orientation of the fine particles changes in accordance with the potential difference between the pixel electrode 216 and the common electrode 218 in the bulk. A degree of at least one of the translucency or dispersion of light is controlled for each pixel PIX by individually controlling the potential of the pixel electrode 216 for each pixel PIX. A scattering degree of the liquid crystal layer (fine particles) is controlled in accordance with the voltage of each pixel electrode 216 and the voltage of the common electrode 218. For example, the liquid crystal layer may be a polymer-dispersed liquid crystal in which a degree of scattering increases as the voltage between each pixel PIX and the common electrode 218 increases, or a polymer-dispersed liquid crystal in which a degree of scattering increases as the voltage between each pixel electrode 216 and the voltage between the common electrode 218 decreases.

The ordinary refractive indices of the bulk and fine particles are equal to each other in the liquid crystal layer 210. In the state where no voltage is applied between the pixel electrode 216 and the common electrode 218, the refractive index difference between the bulk and the fine particles is zero in all directions. The liquid crystal layer 210 becomes a non-scattering state in which the light emitted from the light source is not scattered. The light emitted from the light source propagates in a direction away from a light source 104 (light-emitting part) while being reflected at a first main surface of the array substrate 150 and a first main surface of the opposing substrate 152. In the case where the liquid crystal layer 210 is in the non-scattering state in which the light L emitted from the light source is not scattered, a background of the opposing substrate 152 can be visually recognized from the array substrate 150 and a background of the array substrate 150 can be visually recognized from the opposing substrate 152.

Between the pixel electrode 216 and the common electrode 218 to which the voltage is applied, an optical axis of the fine particles will be tilted due to an electric field generated between the pixel electrode 216 and the common electrode 218. Since an optical axis of the bulk does not change due to the electric field, directions of the optical axis of the bulk and the optical axis of the fine particles are different from each other. In the pixel PIX having the pixel electrode 216 to which the voltage is applied, the light emitted from the light source is scattered. Light which part of the scattered light emitted from the light source as described above is emitted to the outside from the first main surface of the array substrate 150 or the first main surface of the opposing substrate 152 is observed by the observer.

In the pixel PIX having the pixel electrode 216 to which the voltage is not applied, the background on the first main surface side of the opposing substrate 152 can be visually recognized from the first main surface of the array substrate 150 and the background on the first main surface side of the array substrate 150 can be visually recognized from the first main surface of the opposing substrate 152. Further, in the case where the video signal is input to the display device 10 of the present embodiment, a voltage is applied to the pixel electrode 216 of the pixel PIX on which an image is displayed, and an image based on the video signal is visually recognized together with the background. As described above, an image is displayed in the display area when the polymer-dispersed liquid crystal is in the scattering state.

[Connection Relationship Between Gate Drive Circuit and Gate Wiring]

Next, a connection relationship between gate drive circuits 28-1 and 28-2 and the gate wiring GL arranged in the peripheral area 14 will be described with reference to FIG. 11 to FIG. 12C. In the present embodiment, the case where a two-phase drive driver IC is used as the gate drive circuits 28-1 and 28-2 will be described.

Figure 11:
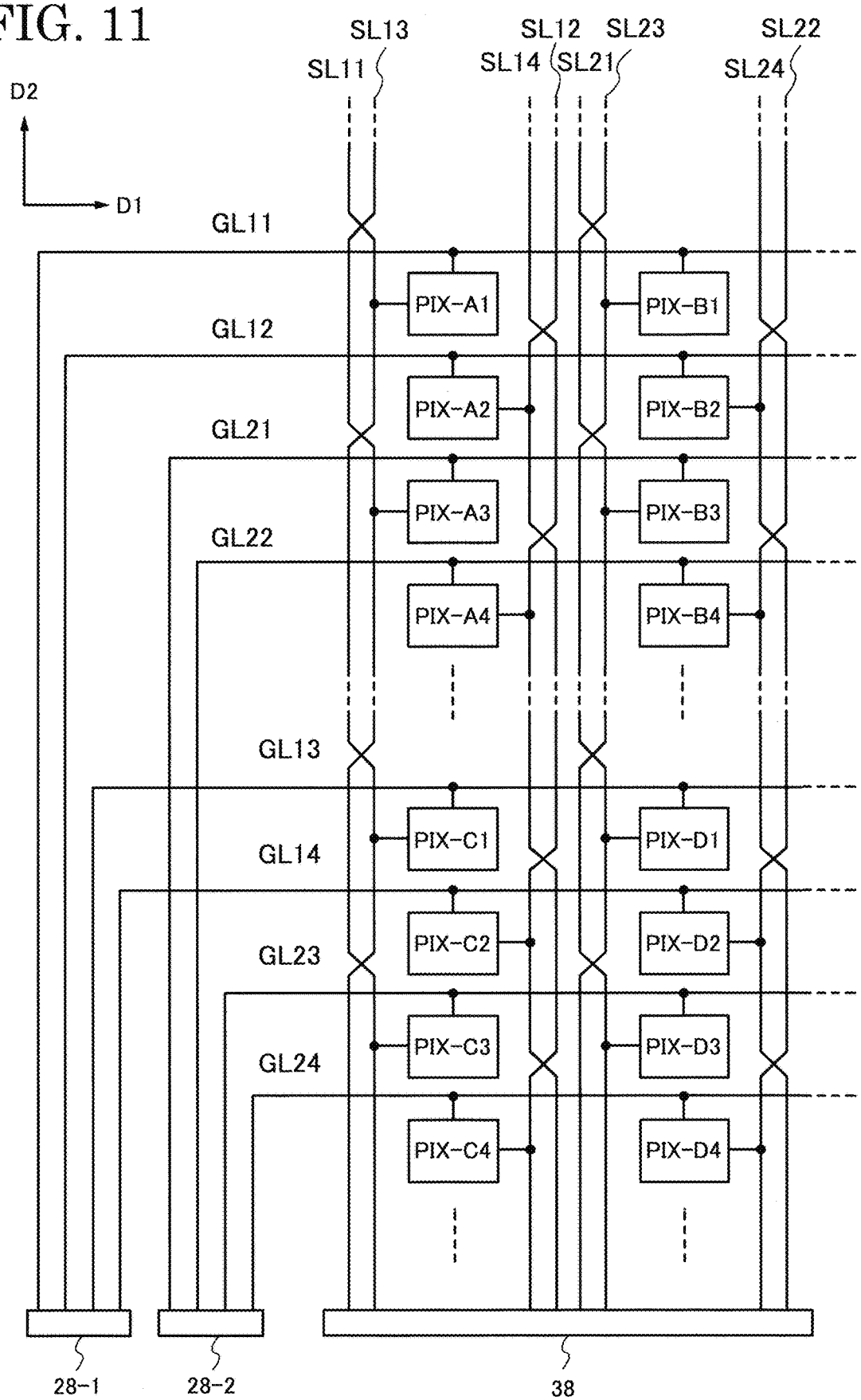
FIG. 11 is a circuit diagram showing a connection relationship between a gate drive circuit and a gate wiring in a peripheral area.

FIG. 11 is a schematic diagram showing a connection relationship between the gate drive circuits 28-1 and 28-2 and gate wirings GL11 to GL14, GL21 to GL24. In FIG. 11, the case where four rows of pixels PIX-A1 to PIX-A4 and PIX-B1 to PIX-B4 are simultaneously turned on in one horizontal period will be described.

The gate drive circuit 28-1 is connected to the gate wirings GL11 to GL14. The gate wiring GL11 is connected to the pixel PIX-A1, and the gate wiring GL12 is connected to the pixel PIX-A2. The gate drive circuit 28-2 is connected to the gate wirings GL21 to GL24. The gate wiring GL21 is connected to the pixel PIX-A3, and the gate wiring GL22 is connected to the pixel PIX-A4.

The source drive circuit 38 is connected to source wirings SL11 to SL14 and SL21 to SL24. The source wiring SL11 is connected to the pixel PIX-A1, and the source wiring SL12 is connected to the pixel PIX-A2. The source wiring SL13 is connected to the pixel PIX-A3, and the source wiring SL14 is connected to the pixel PIX-A4. The source wiring SL21 is connected to the pixel PIX-B1, and the source wiring SL22 is connected to the pixel PIX-B2. The source wiring SL23 is connected to the pixel PIX-B3, and the source wiring SL24 is connected to the pixel PIX-B4.

In the present modification, a two-phase drive driver IC is used as the gate drive circuits 28-1 and 28-2. Therefore, the gate drive circuit 28-1 can simultaneously apply a voltage to the gate wirings GL11 and GL12, and the gate drive circuit 28-2 can simultaneously apply a voltage to the gate wirings GL21 and GL22. That is, four rows of gate wirings GL11, GL12, GL21, and GL22 can be simultaneously turned on. In addition, the video signal is supplied from the source drive circuit 38 to the source wirings SL11 to SL14 and SL21 to SL24. As a result, the pixels PIX-A1 to PIX-A4 and PIX-B1 to PIX-B4 can be simultaneously turned on. In other words, one horizon period can be lengthened in the display device 10.

[Planar Layout of Gate Wiring Extending from Different Gate Drive Circuit]

Next, a specific configuration of the gate wiring area 32 will be described with reference to FIG. 12A to FIG. 12C. Specifically, planar layouts of the plurality of gate wirings GL extending from the different gate drive circuits 28-1 and 28-2 will be described.

FIG. 12A shows a schematic view of the gate drive circuits 28-1 and 28-2 and the plurality of gate wirings GL arranged in the peripheral area 14. In FIG. 12A, an area in which the gate wiring GL extending from the gate drive circuit 28-1 is arranged is represented as an area 62. An area in which the gate wiring GL extending from the gate drive circuit 28-2 is arranged is represented as an area 64. In addition, an area in which the area in which the gate wiring GL extending from the gate drive circuit 28-1 is arranged overlaps the area in which the gate wiring extending from the gate drive circuit 28-2 is arranged is represented as an area 66.

Figure 12B:
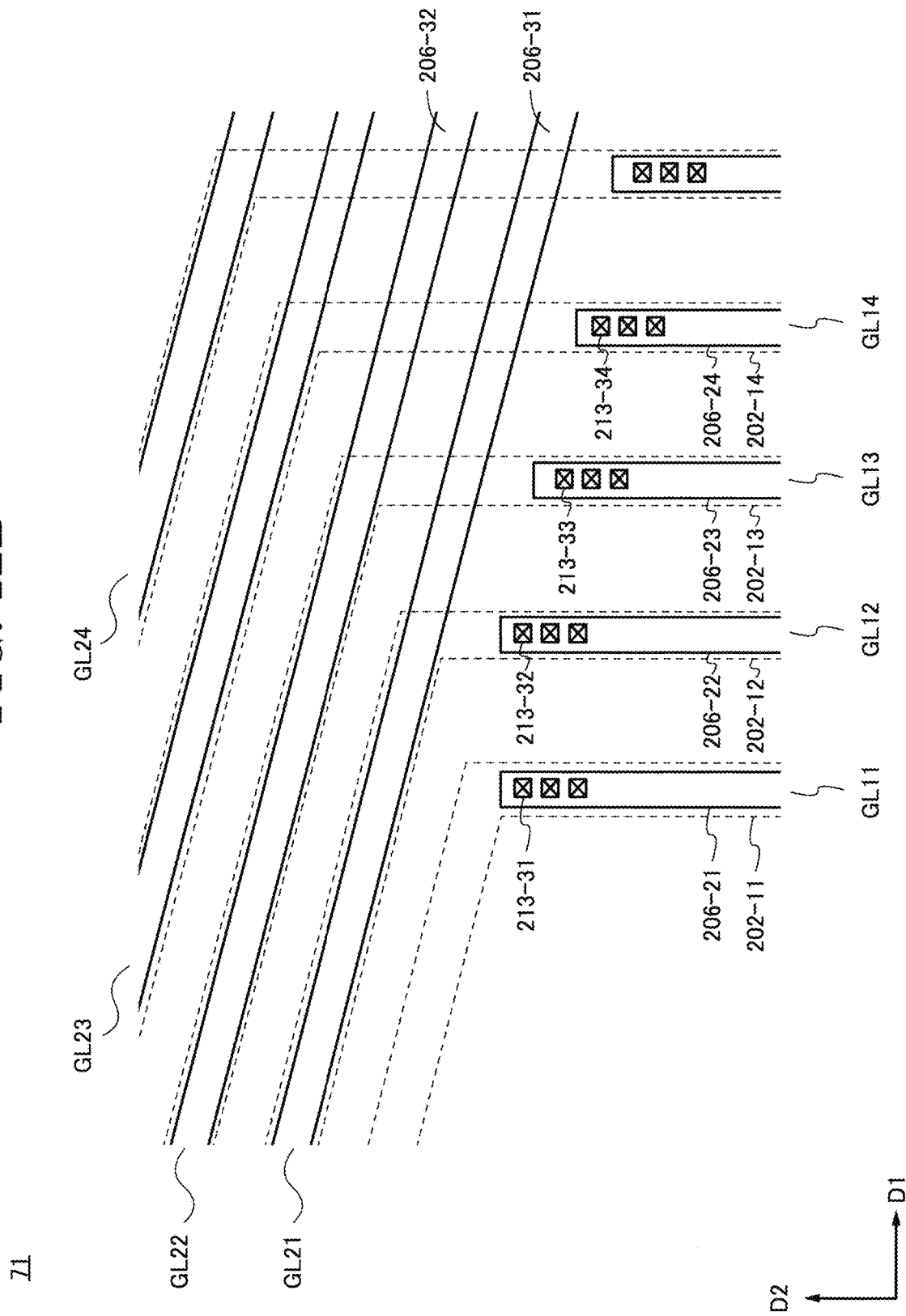
FIG. 12B is a planar layout of a gate wiring in a peripheral area.

FIG. 12B is an enlarged view of an area 71 of the area 66 shown in FIG. 12A. FIG. 12B shows the gate wirings GL11 to GL14 and GL21 to GL24. The gate wirings GL11 to GL14 are connected to the gate drive circuit 28-1. In addition, the gate wirings GL21 to GL24 are connected to the gate drive circuit 28-2 (see FIG. 12A). The gate wirings GL11 to GL14 extending from the gate drive circuit 28-1 are constituted by conductive layers 202-11 to 202-14 and conductive layers 206-21 to 206-24. Each of the conductive layers 202-11 to 202-14 is connected to each of the conductive layers 206-21 to 206-22 via openings 213-31 to 213-34.

The conductive layers 202-12 and 13 have an area overlapping and extending with conductive layers 206-31 and 206-32. In addition, the conductive layers 202-12 and 13 are not connected to the conductive layers 206-31 and 206-32.

Figure 12C:
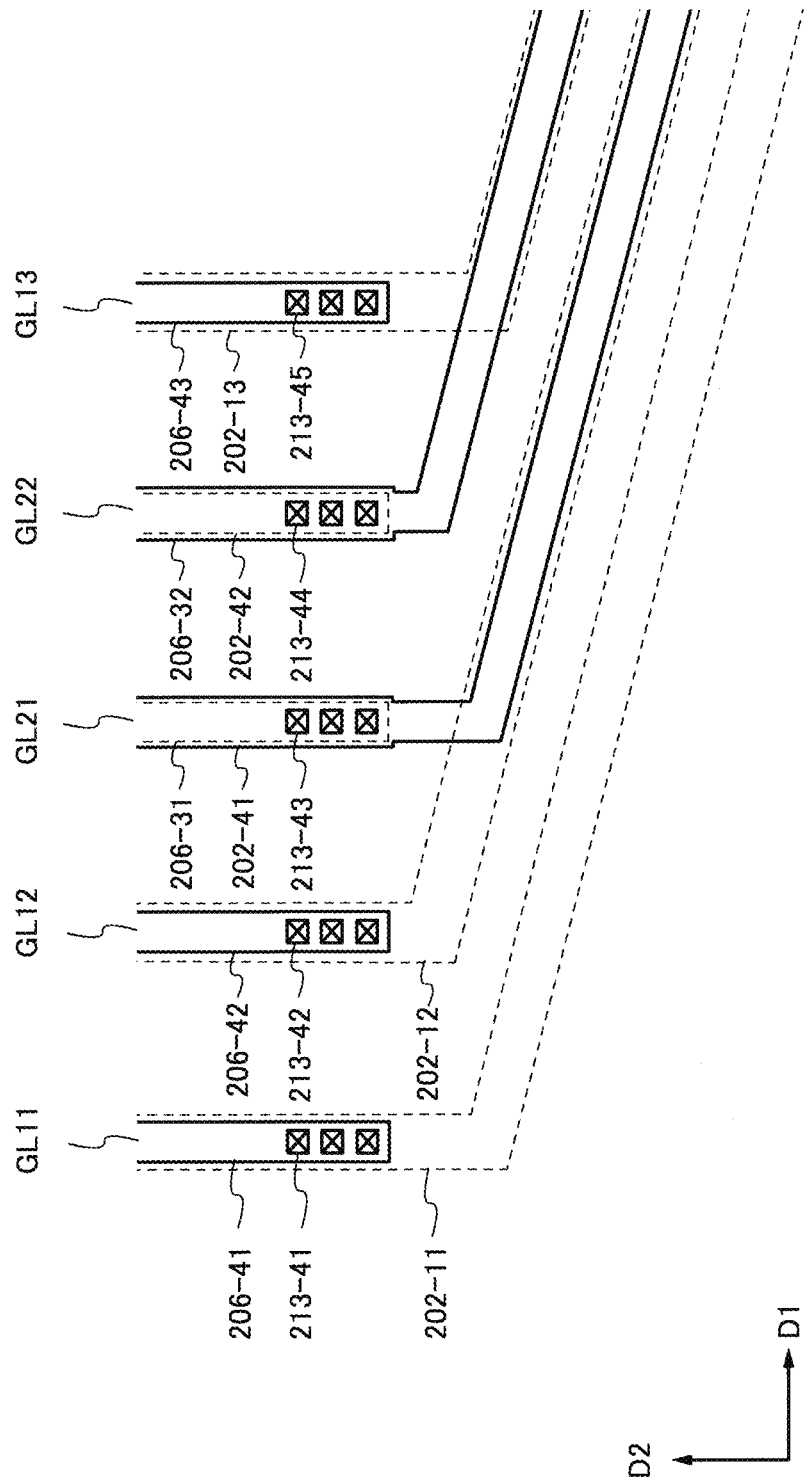
FIG. 12C is a planar layout of a gate wiring in a peripheral area.

FIG. 12C is an enlarged view of an area 72 of the area 66 shown in FIG. 12A. FIG. 12C shows the gate wirings GL11, GL12, GL21, GL22, and GL13. The gate wirings GL11, GL12, and GL13 are wirings extending from the gate drive circuit 28-1. The gate wirings GL21 and GL22 are wirings extending from the gate drive circuit 28-2.

The gate wiring GL11 includes the conductive layer 202-11 and a conductive layer 206-41. The conductive layer 202-11 is connected to the conductive layer 206-41 via an opening 213-41 arranged in the gate insulating film 203. The gate wiring GL12 includes the conductive layer 202-12 and a conductive layer 206-42. The conductive layer 202-12 is connected to the conductive layer 206-42 via an opening 213-42 arranged in the gate insulating film 203. The gate wiring GL21 includes a conductive layer 202-41 and the conductive layer 206-31. The conductive layer 202-41 is connected to the conductive layer 206-31 via an opening 213-43 arranged in the gate insulating film 203. The gate wiring GL22 includes a conductive layer 202-42 and the conductive layer 206-32. The conductive layer 202-42 is connected to the conductive layer 206-32 via an opening 213-44 arranged in the gate insulating film 203. The gate wiring GL13 includes the conductive layer 202-13 and a conductive layer 206-43. The conductive layer 202-13 is connected to the conductive layer 206-43 via an opening 213-45 arranged in the gate insulating film 203.

In addition, in the gate wiring GL11, the conductive layer 202-11 and the conductive layer 206-41 are stacked and extend in the direction D2. Further, the gate wirings GL12, GL21, GL22, and GL13 also extend in the direction D2 in the same manner as the gate wiring GL11.

As shown in FIG. 12B and FIG. 12C, the gate wirings GL11, GL12, and GL13 connected to the gate drive circuit 28-1 are routed to the peripheral area 14 by the conductive layers 202-11 to 202-14. In addition, the gate wirings GL21 and GL22 connected to the gate drive circuit 28-2 are routed to the peripheral area 14 by the conductive layers 206-31 and 206-32. That is, the layer in which the gate wiring extending from the gate drive circuit 28-1 is arranged and the layer in which the gate wiring extending from the gate drive circuit 28-2 is arranged may be arranged in different layers. Therefore, in the gate wiring GL12 and the gate wiring GL21, the conductive layer 202-12 extending from the gate drive circuit 28-1 and the conductive layer 206-31 extending from the gate drive circuit 28-2 can be overlapped and extended. In addition, in the gate wiring GL13 and the gate wiring GL22, the conductive layer 202-13 extending from the gate drive circuit 28-1 and the conductive layer 206-32 extending from the gate drive circuit 28-2 can be overlapped and extended. As a result, the gate wirings GL11, GL12, GL21, and GL22 extending from the differing gate drive circuits 28-1 and 28-2 can be arranged adjacently. In addition, the area occupied by the plurality of gate wirings GL can be reduced.

Next, a modification of the display device 10 according to the present embodiment will be described with reference to FIG. 13 to FIG. 15.

Modification 1

A connection relationship between the gate drive circuits 28-1 and 28-2 and the gate wiring GL arranged in the peripheral area 14 will be described with reference to FIG. 13. In FIG. 13, the case where a four-phase drive driver IC is used as the gate drive circuits 28-1 and 28-2 will be described.

Figure 13:
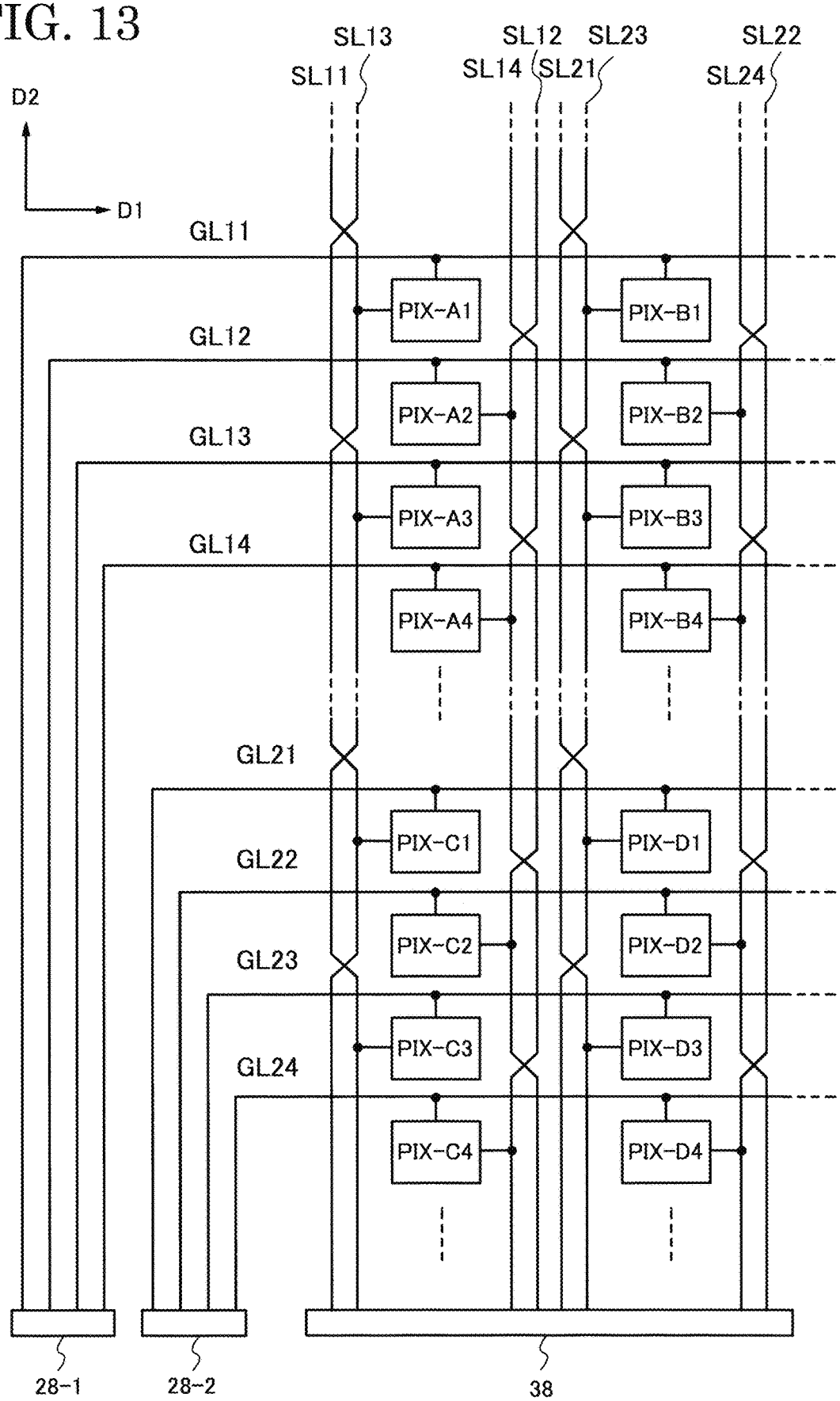
FIG. 13 is a circuit diagram showing a connection relationship between a gate drive circuit and a gate wiring.

FIG. 13 is a circuit diagram showing a connection relationship between the gate drive circuits 28-1 and 28-2 and the gate wirings GL11 to GL14 and GL21 to GL24. In FIG. 13, the case where the four rows of pixels PIX-A1 to PIX-A4 and PIX-B1 to PIX-B4 are simultaneously turned on in one horizontal period will be described.

The gate drive circuit 28-1 is connected to the gate wirings GL11 to GL14. The gate wiring GL11 is connected to the pixel PIX-A1, the gate wiring GL12 is connected to the pixel PIX-A2, the gate wiring GL13 is connected to the pixel PIX-A3, and the gate wiring GL14 is connected to the pixel PIX-A4.

The gate drive circuit 28-2 is connected to the gate wirings GL21 to GL24. The gate wiring GL21 is connected to a pixel PIX-C1, the gate wiring GL22 is connected to a pixel PIX-C2, the gate wiring GL23 is connected to a pixel PIX-C3, and the gate wiring GL24 is connected to a pixel PIX-C4.

The source drive circuit 38 is connected to the source wirings SL11 to SL14 and SL21 to SL24. The source wiring SL11 is connected to the pixel PIX-A1, and the source wiring SL12 is connected to the pixel PIX-A2. The source wiring SL13 is connected to the pixel PIX-A3, and the source wiring SL14 is connected to the pixel PIX-A4. The source wiring SL21 is connected to the pixel PIX-B1, and the source wiring SL22 is connected to the pixel PIX-B2. The source wiring SL23 is connected to the pixel PIX-B3, and the source wiring SL24 is connected to the pixel PIX-B4.

In the present modification, the four-phase drive driver IC is used as the gate drive circuits 28-1 and 28-2. Therefore, the gate drive circuit 28-1 can simultaneously apply a voltage to the gate wirings GL11 to GL14. That is, four rows of the gate wirings GL11 to GL14 can be simultaneously turned on. In addition, the video signal is supplied from the source drive circuit 38 to the source wirings SL11 to SL14 and SL21 to SL24. As a result, the pixels PIX-A1 to PIX-A4 and PIX-B1 to PIX-B4 can be simultaneously turned on. In other words, one horizon period can be lengthened in the display device 10.

Modification 2

A connection relationship between the gate drive circuits 28-1 and 28-2 and the gate wiring GL arranged in the peripheral area 14 will be described with reference to FIG. 14. In the present modification, a driver IC with one simultaneous-output number is used as the gate drive circuits 28-1 and 28-2 will be described.

Figure 14:
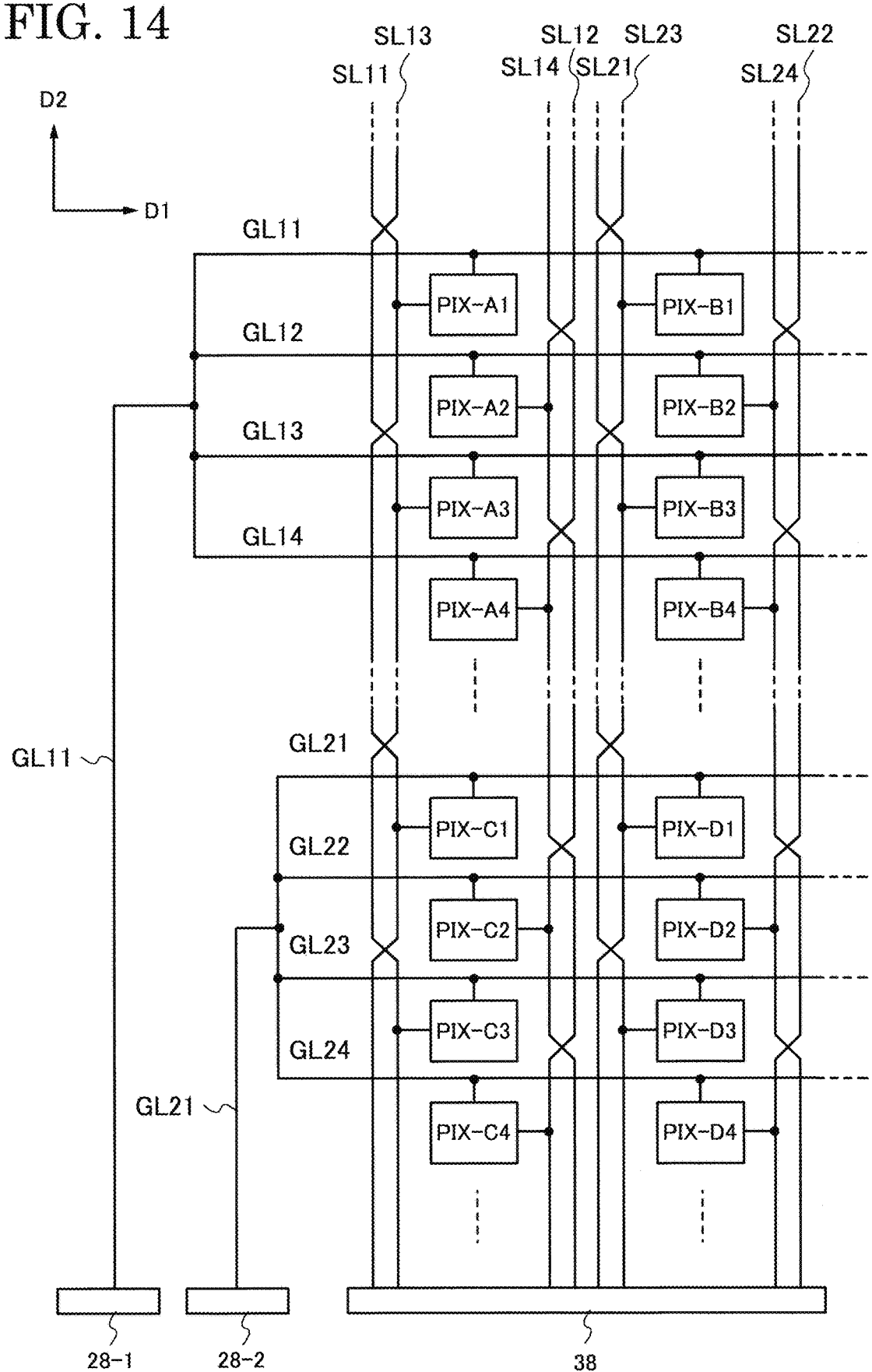
FIG. 14 is a circuit diagram showing a connection relationship between a gate drive circuit and a gate wiring.

FIG. 14 is a schematic diagram showing a connection relationship between the gate drive circuits 28-1 and 28-2 and the gate wirings GL11 to GL14 and GL21 to GL24. In FIG. 14, the case where the four rows of pixels PIX-A1 to PIX-A4 and PIX-B1 to PIX-B4 are simultaneously turned on in one horizontal period will be described.

One gate wiring GL11 connected to the gate drive circuit 28-1 extends in the direction D2. The gate wiring GL11 is branched into the four gate wirings GL11 to GL14 in the vicinity of the pixels PIX-A1 to PIX-A4. As a result, the gate wiring GL11 is connected to the pixel PIX-A1, the gate wiring GL12 is connected to the pixel PIX-A2, the gate wiring GL13 is connected to the pixel PIX-A3, and the gate wiring GL14 is connected to the pixel PIX-A4.

One gate wiring GL21 connected to the gate drive circuit 28-2 extends in the direction D2. The gate wiring GL21 is branched into the four gate wirings GL21 to GL24 in the vicinity of the pixels PIX-C1 to PIX-C4. As a result, the gate wiring GL21 is connected to the pixel PIX-C1, the gate wiring GL22 is connected to the pixel PIX-C2, the gate wiring GL23 is connected to the pixel PIX-C3, and the gate wiring GL24 is connected to the pixel PIX-C4.

The source drive circuit 38 is connected to the source wirings SL11 to SL14 and SL21 to SL24. The source wiring SL11 is connected to the pixel PIX-A1, and the source wiring SL12 is connected to the pixel PIX-A2. The source wiring SL13 is connected to the pixel PIX-A3, and the source wiring SL14 is connected to the pixel PIX-A4. The source wiring SL21 is connected to the pixel PIX-B1, and the source wiring SL22 is connected to the pixel PIX-B2. The source wiring SL23 is connected to the pixel PIX-B3, and the source wiring SL24 is connected to the pixel PIX-B4.

In the present modification, the driver IC with one simultaneous-output number is used as the gate drive circuits 28-1 and 28-2. The gate wiring GL11 is branched into the four gate wirings GL11 to GL14, and each of the gate wirings GL11 to GL14 is set as the pixels PIX-A1 to PIX-A4. As a result, even when the driver IC with one simultaneous-output number is used as the gate drive circuit 28-1, it is possible to simultaneously apply a voltage to the gate wirings GL11 to GL14. That is, the four rows of gate wirings GL11 to GL14 can be simultaneously turned on. In addition, the video signal is supplied from the source drive circuit 38 to the source wirings SL11 to SL14. As a result, the pixels PIX-A1 to PIX-A4 and PIX-B1 to PIX-B4 can be simultaneously turned on. In other words, one horizon period can be lengthened in the display device 10.

Modification 3

The connecting relationship between the gate drive circuits 28-1 and 28-2 and the gate wiring GL arranged in the peripheral area 14 will be described with reference to FIG. 15. In FIG. 15, the case where the two-phase drive driver IC is used as the gate drive circuits 28-1 and 28-2 will be described.

Figure 15:
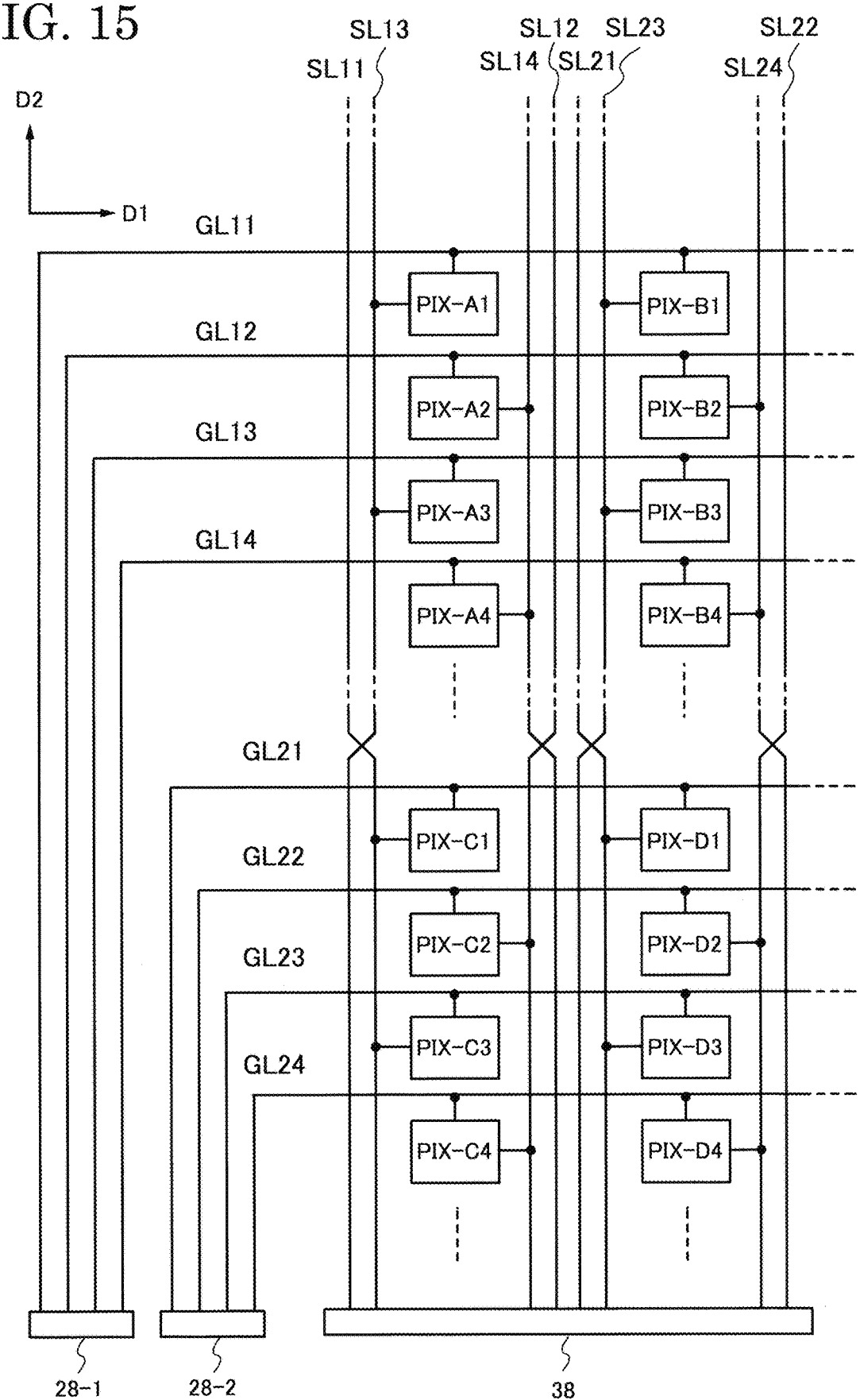
FIG. 15 is a circuit diagram showing a connection relationship between a gate drive circuit and a gate wiring.

FIG. 15 is a schematic diagram showing a connection relationship between the gate drive circuits 28-1 and 28-2 and the gate wirings GL11 to GL14 and GL21 to GL24. In FIG. 15, the case where the four rows of pixels PIX-A1, PIX-A2, and PIX-C1 to PIX-C2 are simultaneously turned on in one horizontal period will be described.

The gate drive circuit 28-1 is connected to the gate wirings GL11 to GL14. The gate wiring GL11 is connected to the pixel PIX-A1, the gate wiring GL12 is connected to the pixel PIX-A2, the gate wiring GL13 is connected to the pixel PIX-A3, and the gate wiring GL14 is connected to the pixel PIX-A4.

The gate drive circuit 28-2 is connected to the gate wirings GL21 to GL24. The gate wiring GL21 is connected to the pixel PIX-C1, the gate wiring GL22 is connected to the pixel PIX-C2, the gate wiring GL23 is connected to the pixel PIX-C3, and the gate wiring GL24 is connected to the pixel PIX-C4.

The source drive circuit 38 is connected to the source wirings SL11 to SL14 and SL21 to SL24. The source wiring SL11 is connected to the pixel PIX-A1, and the source wiring SL12 is connected to the pixel PIX-A2. The source wiring SL13 is connected to the pixel PIX-A3, and the source wiring SL14 is connected to the pixel PIX-A4. The source wiring SL21 is connected to the pixel PIX-B1, and the source wiring SL22 is connected to the pixel PIX-B2. The source wiring SL23 is connected to the pixel PIX-B3, and the source wiring SL24 is connected to the pixel PIX-B4.

In the present modification, the two-phase drive driver IC is used as the gate drive circuits 28-1 and 28-2. Therefore, the gate drive circuit 28-1 can simultaneously apply a voltage to the gate wirings GL11 and GL12, and the gate drive circuit 28-2 can simultaneously apply a voltage to the gate wirings GL21 and GL22. That is, the gate wirings GL11, GL12, GL21, and GL22 can be simultaneously turned on. The video signal can be simultaneously supplied from the source drive circuit 38 to the source wirings SL11 to SL14. As a result, the pixels PIX-A1 and PIX-A2, and PIX-C1 and PIX-C2 separated from the pixels PIX-A1 and PIX-A2 can be simultaneously turned on, so that one horizon period can be lengthened. In addition, there is no need to replace the gate wiring GL extending from the gate drive circuit 28-1 and the gate wiring GL extending from the gate drive circuit 28-2. Therefore, it is possible to simplify the layout of the gate wiring GL.

Modification 5

In FIG. 11 and FIG. 13 to FIG. 15, although the gate drive circuits 28-1 and 28-2 using the driver IC have been described, an embodiment of the present invention is not limited to this. The gate drive circuits 28-1 and 28-2 may be formed above the array substrate 150 using the transistor. In this case, as in FIG. 11 and FIG. 13 to FIG. 15, the gate wirings GL11 to GL14 and GL21 to GL24 may be formed.

Modification 6

In the present embodiment, the case where the source wiring SL1 and the source wiring SL3 are extending in parallel has been described, but not limited to this. The source wiring SL1 may extend stacked with the source wiring SL3. In this case, in the area where the source wiring SL1 overlaps the source wiring SL3, one of the source wiring SL1 and the source wiring SL3 may be formed by the conductive layer 202 and the other may be formed by the conductive layer 206. Similarly, the source wiring SL2 may extend stacked with the source wiring SL4. In this case, in the area where the source wiring SL2 overlaps the source wiring SL4, one of the source wiring SL2 and the source wiring SL4 may be formed by the conductive layer 202 and the other may be formed by the conductive layer 206.

Modification 7

In the present embodiment, although the case where the four rows of the gate wirings GL are simultaneously turned on has been described, an embodiment of the present invention is not limited to this. For example, three rows of the gate wirings GL may be simultaneously turned on, or five or more gate wirings GL may be simultaneously turned on. The number of the source wirings SL connected to the plurality of pixels PIX arranged in one column is determined according to the number of the gate wirings GL to be simultaneously turned on. For example, in the case where five or more gate wirings GL are simultaneously turned on, five source wirings SL may be connected to each of the five pixels PIX arranged in one column.

While preferred embodiments have been described above, the present invention is not limited to such embodiments. The contents disclosed in the embodiments are merely examples, and various changes can be made without departing from the spirit of the present invention. Appropriate changes that have been made without departing from the spirit of the present invention naturally fall within the technical scope of the present invention.

What is claimed is:

1. A display device comprising:
    a first pixel, a second pixel, and a third pixel arranged in a first direction in a display area arranged on a first substrate;
    a first source wiring, a second source wiring, and a third source wiring extending in the first direction, and connected to each of the first pixel to the third pixel; and
    a first gate wiring, a second gate wiring, and a third gate wiring intersecting the first direction, and connected to each of the first pixel to the third pixel;
    wherein the first pixel includes a first transistor electrically connected to the first gate wiring and the first source wiring and a liquid crystal element electrically connected to the first transistor,
    the first pixel to the third pixel are arranged between the first source wiring and the third source wiring, and the second source wiring,
    the first source wiring intersects the third source wiring,
    the first transistor includes a first conductive layer,
    an oxide semiconductor layer is arranged opposite the first conductive layer,
    a gate insulating film is arranged between the first conductive layer and the oxide semiconductor layer,
    a second conductive layer and a third conductive layer are arranged above the oxide semiconductor layer,
    a fourth conductive layer extends in the first direction on the same layer as the first conductive layer and connects to the third conductive layer through a first opening arranged in the gate insulating film,
    a fifth conductive layer extends in the first direction on the same layer as the second and third conductive layers and functions as the third source wiring,
    a sixth conductive layer extends in the first direction on the same layer as the first conductive layer and connects to the fifth conductive layer through a second opening arranged in the gate insulating film,
    the first conductive layer functions as the first gate wiring,
    the third conductive layer functions as the first source wiring, and
    the sixth conductive layer has a first area intersecting the third conductive layer.

2. The display device according to claim 1, further comprising:
    a seventh conductive layer extending in the first direction on the same layer as the second and third conductive layers;

an eighth conductive layer extending in the first direction on the same layer as the first conductive layer and connected to the seventh conductive layer through a third opening arranged in the gate insulating film;

a first insulating film arranged above the second and third conductive layers; and a ninth conductive layer extending in the first direction above the first insulating film, wherein the ninth conductive layer is connected to the fifth conductive layer and the seventh conductive layer through fourth and fifth openings arranged in the first insulating film, and the fifth conductive layer, the seventh conductive layer, and the ninth conductive layer function as the third source wiring.

3. The display device according to claim 1, further comprising:

a fourth pixel arranged adjacent to the third pixel in the first direction;

a fourth gate wiring connected to the fourth pixel and extending in the second direction; and a fourth source wiring connected to the fourth pixel and extending in the first direction, wherein the second source wiring intersects the fourth source wiring.

4. The display device according to claim 3, further comprising:

a first gate drive circuit connected to the first gate wiring and the second gate wiring; and a second gate drive circuit connected to the third gate wiring and the fourth gate wiring, in a peripheral area surrounding the display area.

5. The display device according to claim 4, wherein the second gate wiring has an area overlapping and extending with the third gate wiring, in the peripheral area.

6. The display device according to claim 4, wherein the first to fourth pixels are arranged in a continuous line, and the first to fourth pixels are turned on at the same time.

7. The display device according to claim 6, wherein the first and second pixels are arranged adjacent to each other, the third and fourth pixels are arranged adjacent to each other, the first and second pixels are separated from the third and fourth pixels, and the first pixel and the fourth pixel are turned on at the same time.

8. The display device according to claim 3, further comprising:

a first gate drive circuit connected to the first gate wiring to the fourth gate wiring, in the peripheral area surrounding the display area.

9. The display device according to claim 3, further comprising:

a first gate drive circuit connected to the first gate wiring in the peripheral area surrounding the display area, wherein the second gate wiring to the fourth gate wiring are electrically connected to the first gate wiring.

10. The display device according to claim 1, further comprising:

a second substrate arranged opposite the first substrate;

a liquid crystal layer arranged between the first substrate and the second substrate; and a light source arranged so that light enters a side surface of the first substrate or a side surface of the second substrate.

11. The display device according to claim 10, wherein the liquid crystal layer is a polymer-dispersed liquid crystal, an image is displayed in the display area when the polymer-dispersed liquid crystal is in a scattering state, a background of the second substrate is visible from the first substrate and a background of the first substrate is visible from the second substrate in the display area when the polymer-dispersed liquid crystal is in a non-scattering state.

* * * * *